(12) United States Patent
Lee-Bouhours et al.

(10) Patent No.: US 11,031,518 B2
(45) Date of Patent: Jun. 8, 2021

(54) PHOTOVOLTAIC MODULE COMPRISING A CONCENTRATION OPTIC WITH SUBWAVELENGTH PATTERNS AND SOLAR GENERATOR FOR SATELLITE COMPRISING SAID MODULE

(71) Applicant: THALES, Courbevoie (FR)

(72) Inventors: Mane-Si Laure Lee-Bouhours, Les Molieres (FR); Brigitte Loiseaux, Bures sur Yvette (FR); Frédéric Diaz, Saint-Heand (FR); Gaëlle Lehoucq, Massy (FR)

(73) Assignee: THALES, Courbevoie (FR)

( * ) Notice: Subject to any disclaimer, the term of this patent is extended or adjusted under 35 U.S.C. 154(b) by 58 days.

(21) Appl. No.: 14/797,004

(22) Filed: Jul. 10, 2015

(65) Prior Publication Data

US 2016/0020348 A1 Jan. 21, 2016

(30) Foreign Application Priority Data

Jul. 16, 2014 (FR) ...................................... 14 01587

(51) Int. Cl.
*H01L 31/054* (2014.01)
*G01J 3/02* (2006.01)
(Continued)

(52) U.S. Cl.
CPC .......... *H01L 31/054* (2014.12); *G01J 1/0209* (2013.01); *G01J 1/0407* (2013.01);
(Continued)

(58) Field of Classification Search
CPC ..... H02S 40/22; H02S 40/20; H01L 31/0232; H01L 31/02322; H01L 31/02325;
(Continued)

(56) References Cited

U.S. PATENT DOCUMENTS 4,357,486 A * 11/1982 Blieden ................. H01L 31/055
136/247
4,418,238 A 11/1983 Lidorenko et al.
(Continued)

FOREIGN PATENT DOCUMENTS

FR 2 975 506 A1 11/2012
WO 2011/041637 A2 4/2011
(Continued)

OTHER PUBLICATIONS

Pablo Benitez et al., "High Performance Fresnel-based Photovoltaic Concentrator," Optics Express, vol. 18, No. S1, Apr. 26, 2010, pp. A25-A40.
(Continued)

*Primary Examiner* — Eric R Smith
(74) *Attorney, Agent, or Firm* — BakerHostetler

(57) ABSTRACT

A photovoltaic module comprises at least one photovoltaic cell and one concentration optic device, to be illuminated by a light flux emitting at at least one illumination wavelength belonging to a band of wavelengths defined by a minimum wavelength and a maximum wavelength, the band of wavelengths being that of the solar radiation of the order of [380 nm-1600 nm]. The concentration optic device is a monolithic component and comprises at least one diffractive structure comprising subwavelength patterns, defined in a structured material; the patterns having at least one dimension less than or equal to the average illumination wavelength divided by the refractive index of the structured material; the patterns being separated from one another by subwavelength distances, defined between centres of adjacent patterns; the concentration optic device ensuring at least one focusing function and one diffraction function. A solar panel comprising the photovoltaic module is also provided.

24 Claims, 17 Drawing Sheets

(51) Int. Cl.
| | |
|---|---|
| *G01J 3/18* | (2006.01) |
| *G01J 1/04* | (2006.01) |
| *G01J 1/02* | (2006.01) |
| *H01L 31/047* | (2014.01) |
| *H01L 31/0725* | (2012.01) |
| *G01J 1/42* | (2006.01) |

(52) U.S. Cl.
CPC ........... *G01J 1/0411* (2013.01); *G01J 3/0208* (2013.01); *G01J 3/0259* (2013.01); *G01J 3/1804* (2013.01); *H01L 31/047* (2014.12); *H01L 31/0543* (2014.12); *H01L 31/0549* (2014.12); *H01L 31/0725* (2013.01); *G01J 2001/4266* (2013.01); *Y02E 10/52* (2013.01)

(58) Field of Classification Search
CPC ............. H01L 31/02327; H01L 31/054; H01L 31/0543; H01L 31/0547; H01L 31/0549; H01L 31/055; H01L 31/056; G02B 3/08; B29L 2011/005; F24J 2/062; F24J 2/08; F24J 2/085
USPC .......... 136/244, 246, 259; 359/742; 362/521
See application file for complete search history.

(56) References Cited

U.S. PATENT DOCUMENTS

| | | | |
|---|---|---|---|
| 6,075,200 A | 6/2000 | O'Neill | |
| 2004/0134531 A1* | 7/2004 | Habraken | F24J 2/08 136/246 |
| 2007/0103782 A1 | 5/2007 | Lee et al. | |
| 2009/0320913 A1* | 12/2009 | Smith | G02B 27/1086 136/255 |
| 2010/0278480 A1* | 11/2010 | Vasylyev | G02B 3/005 385/33 |
| 2010/0288352 A1* | 11/2010 | Ji | H01L 31/02168 136/256 |
| 2011/0083739 A1* | 4/2011 | Peng | G02B 5/1809 136/259 |
| 2011/0226332 A1* | 9/2011 | Ford | G02B 6/0053 136/259 |
| 2012/0204956 A1* | 8/2012 | Apostolos | H01L 31/02325 136/259 |
| 2012/0312351 A1 | 12/2012 | Knox | |
| 2013/0153000 A1 | 6/2013 | Lin et al. | |
| 2013/0160850 A1* | 6/2013 | Aspnes | H01L 31/02327 136/259 |
| 2014/0000710 A1* | 1/2014 | Nakahara | G02B 5/0231 136/259 |
| 2014/0130855 A1 | 5/2014 | Gu et al. | |
| 2014/0144506 A1* | 5/2014 | Iizuka | G02B 5/18 136/259 |
| 2014/0182656 A1* | 7/2014 | Bodan | H01L 31/0525 136/246 |
| 2014/0202519 A1* | 7/2014 | Wu | G02B 19/0004 136/246 |
| 2014/0216549 A1* | 8/2014 | Satoh | G02B 5/0215 136/259 |
| 2015/0255639 A1* | 9/2015 | Pelouard | H01L 31/035209 136/246 |
| 2016/0301188 A1* | 10/2016 | Mathai | H01S 5/18386 |

FOREIGN PATENT DOCUMENTS

| | | | | |
|---|---|---|---|---|
| WO | WO-2012124728 A1 * | 9/2012 | ........... | G02B 5/0231 |
| WO | 2013/005231 A2 | 1/2013 | | |
| WO | WO-2013047827 A1 * | 4/2013 | ........... | G02B 5/0215 |

OTHER PUBLICATIONS

Arthur Davis et al., "Optical Design Using Fresnel Lenses: Basic Principles and some Practical Examples," Optik & Photonik, Dec. 2007, No. 4.

Mark O'Neill et al., "Ultra-light stretched Fresnel lens solar concentrator for space power applications," Proceedings of the SPIE 48th Annual meeting, San Diego pp. 5179-17, Dec. 2003.

Celine Michel et al., "Study of solar concentrator for space, based on a diffractive/refractive combination," Renewable Energy and the Environment, Optical Society of America, SM2A2, 2012.

Philippe Lalanne et al., "Blazed binary subwavelength gratings with efficiencies larger than those of conventional échelette gratings," Optics Letters, Optical Society of America, 1998, vol. 23, No. 14, pp. 1081-1083.

M. S. L. Lee et al., "Imaging with blazed-binary diffractive elements," Journal of Optics A: Pure and Applied Optics, vol. 4, 2002, pp. S119-S124.

Christophe Sauvan et al., "Broadband blazing with artificial dielectrics," Optics Letters, Optical Society of America, 2004, vol. 29, No. 14, pp. 1593-1595.

Celine Ribot, "Etude des optiques diffractives en imagerie infrarouge," PhD Thesis from University of Paris Sud, 2008.

M. S. L. Lee et al., "Sub-wavelength structures for broadband diffractive optics," ICOXX—20th Congress of the International Commission for Optics, 0602-34, 2005.

Guillaume Bloom et al., "Design and optimization of a high efficiency array generator in the mid-IR with binary subwavelength grooves," Applied Optics, Feb. 10, 2011, vol. 50, No. 5, pp. 701-709.

Guillaume Bloom, "Combinaison cohérente de lasers à cascade quantique (Coherent Combination of Quantum Cascaded Lasers)" upheld on Feb. 14, 2012, Paris University XI Orsay.

\* cited by examiner

PHOTOVOLTAIC MODULE COMPRISING A CONCENTRATION OPTIC WITH SUBWAVELENGTH PATTERNS AND SOLAR GENERATOR FOR SATELLITE COMPRISING SAID MODULE

CROSS-REFERENCE TO RELATED APPLICATION

This application claims priority to foreign French patent application No. FR 1401587, filed on Jul. 16, 2014, the disclosure of which is incorporated by reference in its entirety.

FIELD OF THE INVENTION

The domain of the invention is that of the photovoltaic devices comprising concentration optics making it possible to increase the performance levels thereof.

BACKGROUND

Generally, in the terrestrial applications that use solar panels, and do so in large quantities, it is essential to seek to reduce the costs of the photovoltaic modules used, while increasing the efficiency thereof.

To reduce the costs, different strategies are employed. They can notably relate to:
  the cell of photosensitive material employed. It is possible to seek to reduce the thickness thereof, by using thin films of material, on inexpensive substrates or by acting on the very nature of the material;
  the architecture of the structure by using light concentrating systems which focus the incident light onto a cell of smaller surface area to reduce the surface area of photovoltaic material. FIG. 1 represents a module with photovoltaic concentrator, using a Fresnel lens based on microprisms. By geometrical construction, it is possible to greatly reduce the size of the cell. Currently, the concentration factors are of the order of 500, even more, for the terrestrial applications. In this case, a two-axis system for following the sun, commonly called "tracking", is necessary to best follow the orientation of the sun.

Among these various strategies, efforts are focused primarily on increasing the efficiency of the cell.

The technology exhibiting the best efficiencies and having the steepest progression is the technology based on so-called multijunction structure, combined with a concentrator. A multijunction structure comprises the stacking of different junctions made up of different materials sensitive in different wavelength ranges, having the advantage of being able to effectively pick up the entire spectral range forming the solar spectrum. A multijunction structure offers a better efficiency than a single-junction structure but represents a greater cost because of its greater complexity. This is why it may be interesting to combine a multijunction structure with a light concentrator, to greatly reduce the surface area of the cell and therefore the cost of the complete module. As an illustration, FIGS. 2a and 2b represent, respectively:
  a photovoltaic cell CV comprising, in the example illustrated the stack of materials M1, M2, M3 and M4 sensitive in ranges of wavelengths $\Delta\lambda 1$, $\Delta\lambda 2$, $\Delta\lambda 3$ and $\Delta\lambda 4$;
  a photovoltaic module CPV using a concentration optic Oc and said cell CV.

The efficiency of a multijunction CPV module is approximately 41% for a triple-junction based on GaInP/GaInAs/Ge, that can achieve efficiencies of 44.7% for a quadruple junction (with a single GaAs junction, the maximum efficiency is of the order of 32%).

FIG. 3, taken from the article P. Benitez, J. C. Miñano, P. Zamora, R. Mohedano, A. Cvetkovic, M. Buljan, J. Chaves, M. Hernández, "High performance Fresnel-based photovoltaic Concentrator", Optics express, vol 18, S1, page A25-A40 (2010) illustrates different types of concentrators operating in transmission and used for terrestrial photovoltaic modules, and, more specifically, from left to right:
  a concentrator based on a Fresnel lens with microprisms (with no secondary optical element);
  a concentrator with, for secondary optical element, a spherical dome;
  a concentrator with, for secondary optical element, an SILO (SingLe Optical surface) component offered by the Sandia Labs laboratory;
  a concentrator with, for secondary optical element, a truncated hollow reflecting pyramid (XTP), used by the company Amonix;
  a concentrator with, for secondary optical element, a truncated dielectric pyramid (RTP), used by the company Solfocus;
  a concentrator with, for secondary optical element, a Fresnel Köhler (FK) concentrator with four quadrants, proposed by Benitez et al.

Generally, the primary optic (corresponding to the top part of the configurations represented in FIG. 3) is called Fresnel lens, called of microprism type, exclusively based on the refraction principle.

In effect the same focusing function can be maintained by removing material as long as the curved surface is maintained. The principle of construction of such a lens is illustrated in FIG. 4. The lens is made up of a plurality of microprisms. The use of the microprisms allows for a more compact approach than that obtained with a standard refractive lens for the focusing of the light, as described in the article by: A. Davis, F. Kuhnlenz "Optical Design using Fresnel Lenses", Optik & Photonik, December 2007 N° 4. They have the advantage of being flat (typically between 200 µm and 3 mm thick) compared to conventional refractive lenses, but, like the latter, they are chromatic, the focal distance depending on the dispersion of the material.

FIGS. 5a and 5b illustrate the effect of this dispersion on the refractive index of the material on the efficiency of the lens (the proportion of light arriving on the cell) for a radiation emitting at a minimum wavelength $\lambda_{min}$ and a maximum wavelength $\lambda_{Max}$, assuming that the cell is placed equidistantly from the two focusing points $f(\lambda_{min})$ and $f(\lambda_{Max})$. It will be noted that the quantity of light collected at $\lambda_{min}$ as represented in FIG. 5a (dark grey zone) is less than the quantity of light collected at $\lambda_{Max}$ as represented in FIG. 5b (light grey zone), the cross-hatched zones corresponding to the lost light.

The essential point is therefore to find the best trade-off for the placement of the cell along the optical axis (longitudinally), to optimize the optical efficiency. Because of the chromatism, the light at the wavelength $\lambda_{min}$ focuses at a distance $f(\lambda_{min})$ different from the light at the wavelength $\lambda_{Max}$ which focuses at $f(\lambda_{Max})$. Since the light from the sun is wideband, the aim is to find the best trade-off for the placement of the cell. Initially, the first reflex in imaging is to place the cell equidistantly between the two focusing points $f(\lambda_{min})$ and $f(\lambda_{Max})$. However, this position is not optimal since, from the point of view of the collection of light, the quantity of light collected at $\lambda_{min}$ (dark grey zone in FIG. 5a) is less than the quantity of light collected at $\lambda_{Max}$ (shaded zone in FIG. 5b), the cross-hatched zones corresponding to the lost light.

In parallel with these transmission-based systems, there are also reflection-based systems. FIG. 6 illustrates a few examples of reflection-based systems based on systems with mirrors M returning the light radiation focused towards the cell CV. Their advantage is their insensitivity to the wavelength, but, they exhibit a zone of obscuration and are more bulky.

It is moreover advisable to take into account, in addition to the optical efficiency, two important parameters involved in the dimensioning of a CPV module: the aperture of the source and the thermal effects.

Thus, it is best to take into account the notion of acceptance angle, a major parameter which is a function of the concentration factor. For the terrestrial applications in which the concentration factors can be very significant, the acceptance angles are very low, of the order of 0.5°-1°. It is therefore necessary to incorporate a tracking system that is generally complex and costly.

FIGS. 7a, 7b and 7c illustrate the geometrical constraints linked to the angular diameter of the sun θs (typically 0.5°) and the acceptance angle α of the device, according to three different configurations and do so by assuming, in all three cases, a fixed cell size and a fixed lens diameter. More specifically:

FIG. 7a represents the plot of rays when the sun is in the vertical, so-called "normal" incidence. The main ray corresponds to the continuous lines. The rays taking into account the size of the sun are in dotted lines;

FIG. 7b represents the plot of rays when the sun rotates, so-called "oblique" incidence. The acceptance angle α is defined by the maximum angle of inclination of the main ray for it not to leave the sensitive zone;

FIG. 7c represents the plot of ray on a more open lens (corresponding to a smaller focal length-to-diameter ratio), the acceptance angle increases.

To increase the acceptance angle, it is possible, given constant cell size, to increase the numerical aperture of the lens (for this, it is best to reduce the focal length of the lens, which amounts effectively to increasing the numerical aperture when working with identical diameters). However, that can be done only if the lens does not exhibit excessive optical losses, therefore does not make it possible to consider solutions based on Fresnel lenses with open microprisms. The microprisms of a Fresnel lens have to be more inclined, notably at the periphery. The chromatic dispersion is therefore greater, leading to losses of optical efficiency not counting the difficulty in producing the extreme zones and the internal reflections.

A second major parameter to be taken into account is the thermal aspect. Under concentration, it is necessary to couple a thermal management system to the cell in order to maintain a temperature compatible with the rated temperature of use of the cell and not degrade its efficiency. This aspect can prove to be a limiting parameter for certain applications.

Following the success of the concentration photovoltaic modules CPV, in the terrestrial domain, combining a multijunction cell CV with high efficiency and a concentration system, more recent studies have emerged in the space domain.

In the space domain, the need is formulated with respect to the solar panels used for the solar generators of the satellites, for which the aim is to increase the efficiency as in the terrestrial domain, but the issues are different to those of the terrestrial applications.

On the one hand, the environmental conditions are different, the compactness and the weight become much more important criteria than in the terrestrial domain, whereas the cost of the module in itself becomes a lesser criterion.

On the other hand, the concentration factors sought are lower than in the terrestrial applications because they are linked to a tracking system that has to be more tolerant angularly because of their use notably in geostationary orbit. Thermal management constraints are encountered that are different from those encountered in the terrestrial domain.

Finally, new criteria come into play like the computability with the panel deployment systems.

These days, two types of concentration solutions have been explored for the applications in the space domain:
  transmission-based solutions (typically with Fresnel lenses);
  reflection-based solutions (mirror systems) that proof less effective because they exhibit performance degradations linked to the contamination of the mirrors in the space environment.

A comparison of the surface defect effects of the transmission-based and reflection-based concentrators is notably described in the article: "Ultra-light stretched Fresnel lens solar concentrator for space power applications", SPIE 48th Annual meeting, San Diego paper 5179-17 (2003).

A transmission-based configuration is mentioned therein, illustrating the "SLA Stretched Lens Array" concept and comprising flexible cylindrical Fresnel lenses made of silicone polymer, deployed and held by arches which stretch the lenses in the direction of their greatest dimension, as illustrated in FIGS. 8a, 8b and 8c. More specifically:

FIG. 8a represents a general view;

FIG. 8b illustrates the two positions of the concentrator, the bottom diagram of the figure: the position of the concentrator in storage position and during the launching of the satellite, the top diagram: the position after deployment of the panels and deployment of the lenses (Entech patent: U.S. Pat. No. 6,075,200, "Stretched Fresnel lens concentrator for spacer power", Entech 2000);

FIG. 8c illustrates a cross section of the lens stretched after deployment of the concentrator: "Ultra-light stretched Fresnel lens solar concentrator for space power applications", SPIE 48th Annual meeting, San Diego paper 5179-17 (2003).

The transmission-based solution proposed by the company Entech (US), comprises triple-junction cells combined with cylindrical lenses obtained by stretching a silicone film. The curved lenses are in fact formed by a lens, allowing for the geometrical concentration function, combined with microprisms making it possible to correct the chromatic aberrations (by controlling the focusing of the rays as a function of the wavelength). The angle of each prism is determined so as to minimize the chromatic aberrations. Note that this optimization of the efficiency is also facilitated by the fact that the size of the cell is relatively great (low concentration factor).

From an operational point of view, after launching of the satellite, this system is deployed in two steps:
  a first step corresponding to the deployment of the solar panels;
  a second step corresponding to the deployment of the concentrators by virtue of a mechanical curvature system, this last step potentially constituting a significant risk of bad deployment (therefore non-operational panels and therefore non-operational solar generator) and which requires a terrestrial qualification phase that is particularly costly in terms of test means.

Generally, it should be noted that the concentration techniques can also be combined advantageously with spectral separation techniques, consisting in spatially (laterally) separating the solar spectrum, as in the approach proposed by the Liege space centre (CSL) and described in the article by: C. Michel et al., "Study of solar concentrator for space, based on a diffractive/refractive combination", "Renewable Energy and the Environment, OSA, SM2A2 (2012).

By using multijunction modules for their wide wavelength sensitivity spectrum, limitations linked to this type of module nevertheless have to be overcome. The two main limitations of multijunction modules are in effect as follows:
the condition of cell tuning between the materials at the interfaces between the junctions (which causes the intrinsic efficiency of the materials to be reduced when they are stacked). The first limitation restricts the choice of materials and therefore limits the implementation in a better combination in terms of efficiency;
the current matching condition: since the junctions are connected in series, the least effective junction limits the current for all the junctions. Furthermore, because of the mutual dependency of the different junctions, the multijunction structure is more sensitive to non-gauged changes of the spectrum or to ageing of a junction.

By using different single junctions, and with lateral spectral separation techniques, it is possible to obtain the following combined advantages:
a better theoretical efficiency via:
the elimination of the matching losses linked to the interfaces between the junctions;
the possibility of using different materials, possibly better matched to the spectrum;
the possibility of implementing an antireflection coating of better performance because it is optimized to each horizontal junction;
a lower operating temperature by virtue of the distribution over a greater surface area of the concentrated flux making it possible to relax the constraints with respect to thermal management, therefore reduce the cost thereof and operate with better efficiency.
a light flux on a greater surface area (three times larger in the case of three junctions separated horizontally (or laterally) compared to a vertical triple junction), making it possible either to facilitate the thermal management which is an essential point notably for space applications with low concentration or for high concentration terrestrial applications, or to keep the initial thermal management and use the cells at lower temperature and therefore offering a better efficiency;
the use of a number of cells arranged horizontally makes it possible to multiply the number of junctions in the horizontal plane, for a better efficiency. This is not the case with a vertical multijunction where the number of junctions becomes limited because of the cell matching conditions. It also makes it possible to adapt the surface area of the junctions independently of one another (since they are distributed horizontally) to pick up more flux on the cells with lower efficiency, so as to make the efficiencies of the different junctions uniform for an optimal series assembly and avoid having the least effective of the junctions limit the current for all the junctions.

From a technological point of view, spectral separation solutions have been published/patented and use essentially refractive microprisms. Exemplary architectures for spatio-chromatic separation are described in the patent application US 2012 0312351 "efficient solar energy concentrator with improved thermal management" and are illustrated in FIG. 9a: architecture in the projection and in FIG. 9b: prism architecture.

SUMMARY OF THE INVENTION

In this complex context of integration of numerous parameters, the subject of the present invention is a photovoltaic module with high performance levels, small bulk and suited to both terrestrial and space applications. The photovoltaic module of the invention exhibits a great compactness and a great efficiency making it possible to further improve the performance levels of the prior art solutions and notably for applications in the space domain making it possible to not require several successive operations for the deployment in space of solar panels and concentrators, as in the prior art.

More specifically, the subject of the present invention is a photovoltaic module comprising at least one photovoltaic cell and at least one concentration optic device, intended to be illuminated by a light flux emitting at at least one illumination wavelength $\lambda i$ belonging to a band of wavelengths defined by a minimum wavelength $\lambda_{min}$ and a maximum wavelength $\lambda_{max}$, said band of wavelengths being that of the solar radiation of the order of [380 nm-1600 nm], characterized in that:
said concentration optic device is a monolithic component and comprises at least one diffractive structure comprising subwavelength patterns, defined in a so-called structured material;
said patterns having at least one dimension less than or equal to the average illumination wavelength $\lambda_c$ situated between $\lambda_{min}$ and $\lambda_{max}$ divided by the refractive index of said structured material;
said patterns being separated from one another by subwavelength distances defined between centres of adjacent patterns;
said concentration optic device ensuring at least one focusing function and one diffraction function.

According to a variant of the invention, said diffractive structure comprises subwavelength patterns exhibiting distances defined between centres of adjacent patterns that are periodic.

According to a variant of the invention, the concentration optic device comprises two diffractive structures comprising subwavelength patterns, defined in at least one so-called structured material, of which one ensures a focusing function.

According to a variant of the invention, the concentration optic device comprises two diffractive structures on each of its faces.

According to a variant of the invention, the concentration optic device comprises a diffractive structure comprising subwavelength patterns and a refractive optic.

According to a variant of the invention, the refractive optic comprises at least one curved surface refractive lens.

According to a variant of the invention, the refractive optic comprises at least one Fresnel lens comprising a set of microprisms of an approximate size of one to a few hundreds of microns.

For example, these microprisms can have a dimension between 1.3 mm and 110 μm on a thickness of 20 μm. Said microprisms can have the same width but exhibit different heights, a typical width of the microprisms can be of the order of 100 µm for a focal length of 5 mm.

According to a variant of the invention, the refractive optic is produced in the same material as the structured material comprising said patterns of subwavelength dimensions.

According to a variant of the invention, the patterns are pillars or holes.

According to a variant of the invention, the concentration device comprises a diffractive structure with patterns of subwavelength dimensions defined in a so-called structured material having a longitudinal aberration correction function and/or a lateral spectral separation function.

According to a variant of the invention, the concentration device comprises a central zone and outer zones;
  each zone being made up of patterns of pillar type with round or square section and/or hole type with round or square section;
  the dimensions of said patterns varying from one zone to another so as to code a variation of the effective index and therefore a phase variation, said variations of dimension being able to be monotonic or not.

According to a variant of the invention, the patterns exhibit lateral dimensions less than or equal to 350 nm and the spacing between the centre of two consecutive patterns being approximately 350 nm and with a height of the order of 1 to a few microns.

According to a variant of the invention, said photovoltaic cell comprises a stack of materials, producing a so-called vertical multijunction structure, each of said materials being at least sensitive in a subband of wavelengths, belonging to said band of wavelengths, $\Delta\lambda=[\lambda_{min}; \lambda_{max}]$.

According to a variant of the invention, said photovoltaic cell comprises a set of individual adjacent photovoltaic subcells in one and the same plane comprising materials sensitive in subbands of wavelengths, belonging to said band of wavelengths $\Delta\lambda=[\lambda_{min}; \lambda_{max}]$, so as to constitute a so-called horizontal multijunction structure.

According to a variant of the invention, the photovoltaic module comprises subsets of individual photovoltaic cells, situated in different planes.

According to a variant of the invention, the photovoltaic module comprises individual photovoltaic subcells exhibiting different sizes relative to one another.

According to a variant of the invention, the refractive optic is produced in the same material as the structured material comprising said patterns of subwavelength dimensions.

According to a variant of the invention, said structured material is a dielectric of silica, glass, $Si_3N_4$ type, or of polymeric material that can be polydimethylsiloxane (PDMS), or poly(methyl methacrylate) (PMMA), or polycarbonate (PC).

According to a variant of the invention, the dimensions of the patterns are less than or equal to 350 nm in width and of the order of 1 to 2 µm in height.

According to a variant of the invention, the dimensions of the patterns are of the order of 80 nm to 250 nm in width or in diameter, 1 to 2 µm in height.

According to a variant of the invention, the patterns are holes or pillars.

According to a variant of the invention, the photovoltaic module with concentration comprises a set of individual photovoltaic cells.

According to a variant of the invention, the concentration optic device comprises a set of microlenses, each microlens being coupled to a diffractive structure comprising patterns of subwavelength dimension.

According to a variant of the invention, the concentration optic device comprises a set of Fresnel lenses with microprisms, each Fresnel lens being coupled to a diffractive structure comprising patterns of subwavelength dimensions.

Also the subject of the invention is a solar panel for solar generator for satellite comprising at least one photovoltaic module according to the invention.

BRIEF DESCRIPTION OF THE DRAWINGS

The invention will be better understood and other advantages will become apparent on reading the following description, given in a nonlimiting manner and through the figures in which.

DETAILED DESCRIPTION

The subject of the present invention is a photovoltaic module comprising at least one photovoltaic cell and one concentration optic device comprising a structure comprising subwavelength patterns, defined in a so-called structured material, of which at least one dimension of said patterns is less than said average illumination wavelength ($\lambda_c$) divided by the refractive index of said structured material, said concentration optic device ensuring at least a focusing function and a diffraction function.

The focusing function is ensured by a refractive optic of lens type associated with a diffractive structure comprising subwavelength patterns, defined in a so-called structured material of which at least one dimension of said patterns is less than said average illumination wavelength over the illumination spectrum ($\lambda_c$) divided by the refractive index of said structured material.

Figure 1:
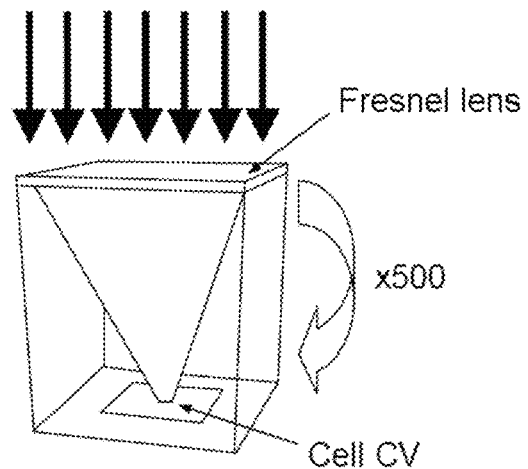
FIG. 1 schematically represents a photovoltaic module of the known art comprising a photovoltaic cell and a concentration optic.
Figure 2A:
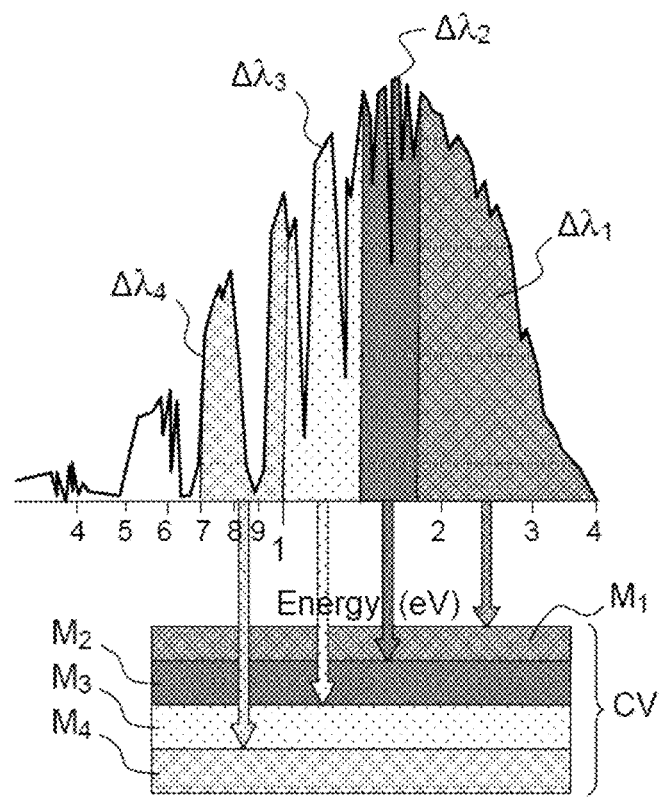
FIGS. 2a and 2b respectively illustrate a photovoltaic cell comprising a multijunction structure of stacked materials and a module incorporating said cell.
Figure 2B:
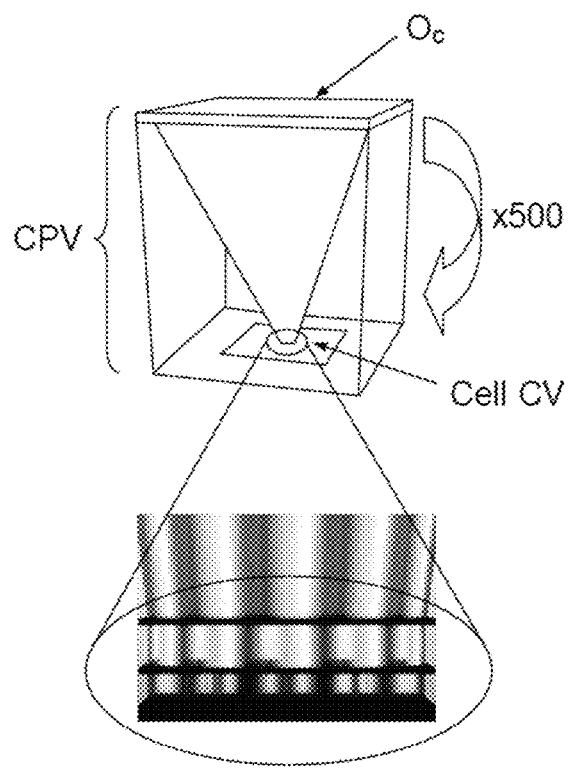
Figure 3:
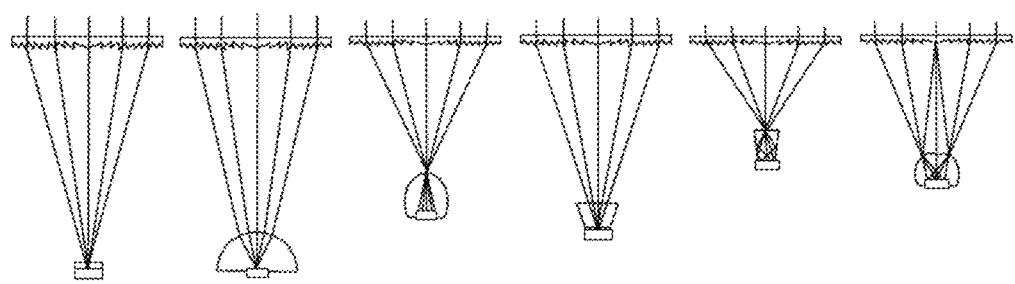
FIG. 3 illustrates different optical concentrator solutions operating in transmission, proposed in the prior art and incorporated in photovoltaic modules.
Figure 4:
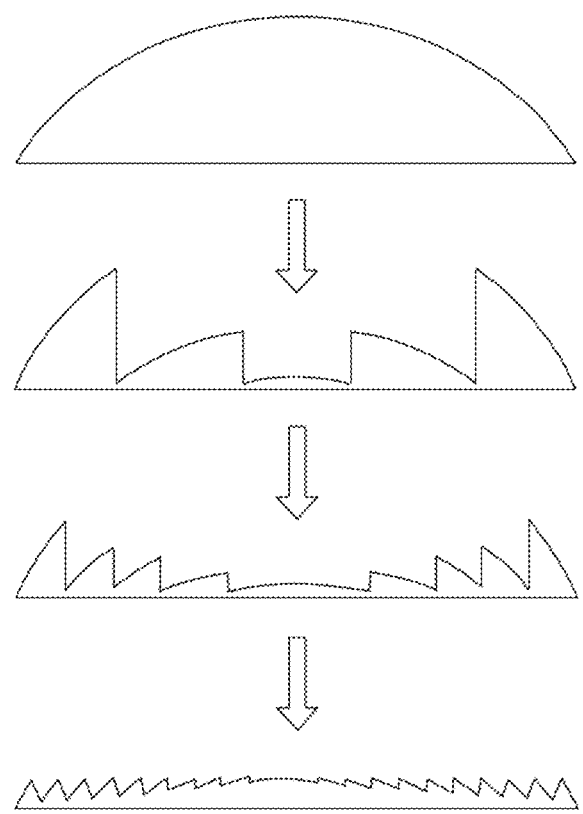
FIG. 4 illustrates a Fresnel lens structure comprising microprisms.
Figures 5A, 5B:
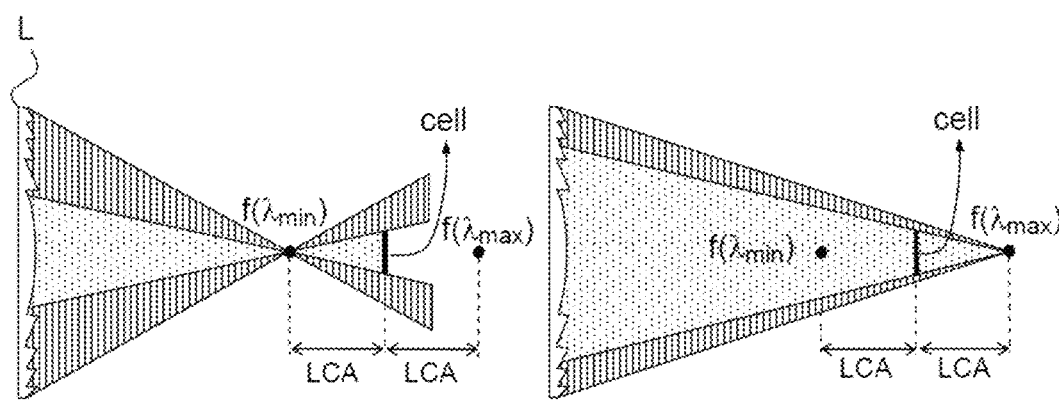
FIGS. 5a and 5b illustrate the chromatic effect of a diffractive Fresnel lens, on the efficiency of said lens for two different positions of the lens relative to the cell.
Figure 6:
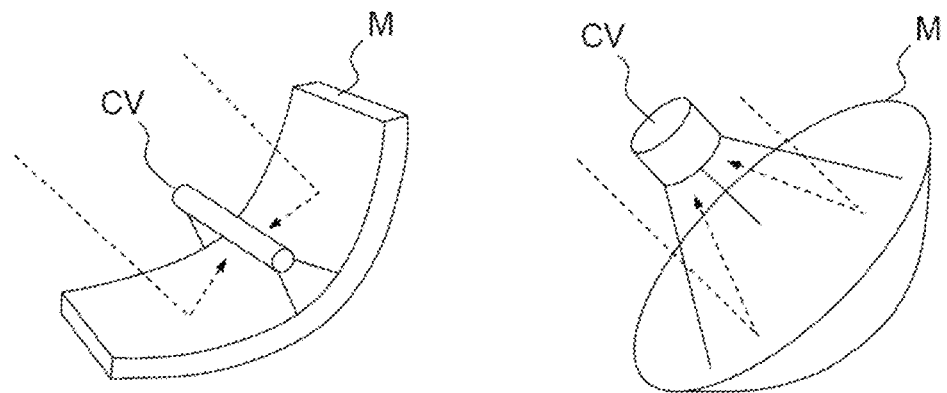
FIG. 6 illustrates different optical concentrator solutions operating in reflection, proposed in the prior art and incorporated in photovoltaic modules.
Figures 7A, 7B, 7C:
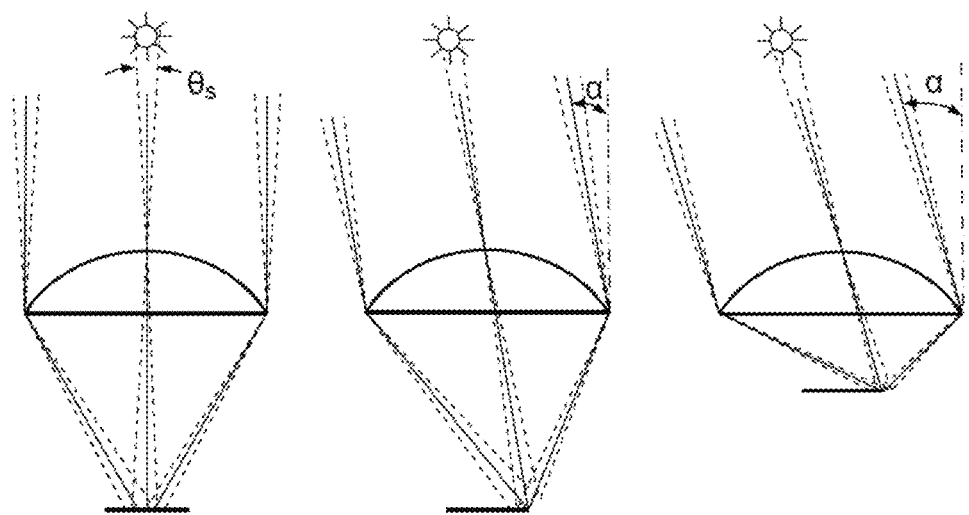
FIGS. 7a, 7b and 7c illustrate the geometrical constraints linked to the angular dimension of the sun θs and the acceptance angle α of the device, according to three different configurations.
Figure 8A:
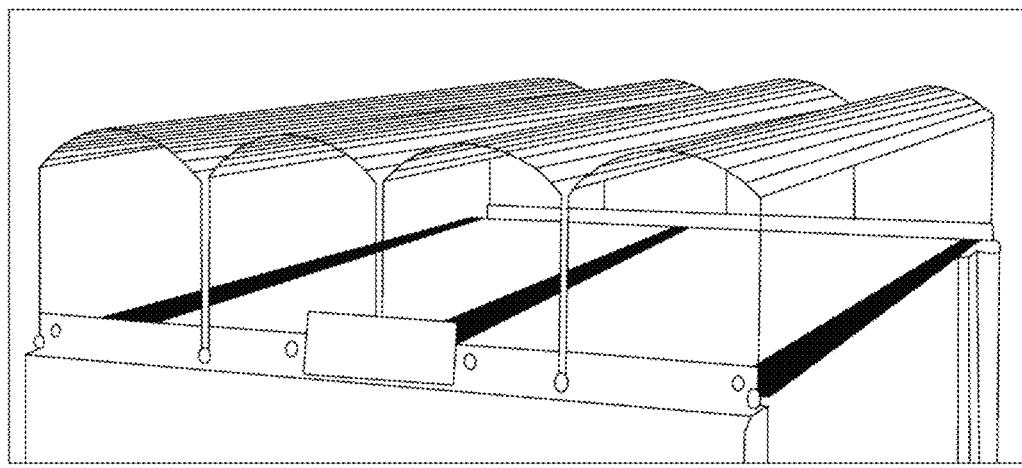
FIGS. 8a, 8b, 8c illustrate a photovoltaic module configuration for space application proposed in the prior art.
Figure 8B:
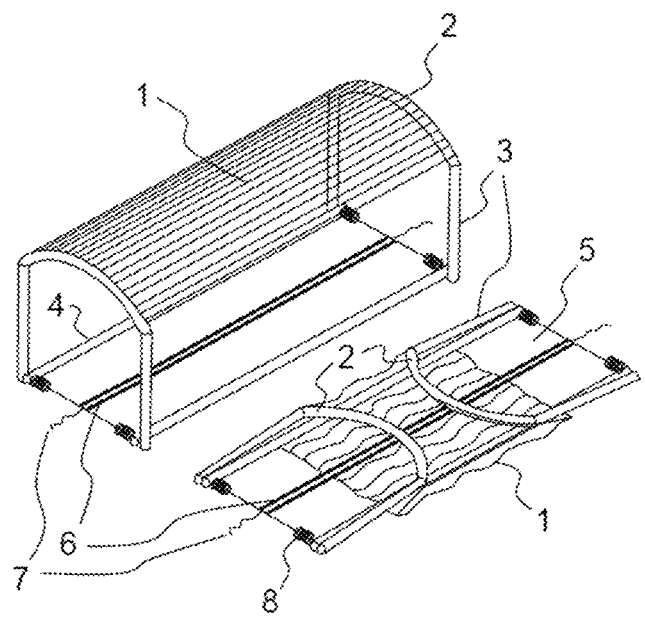
Figure 8C:
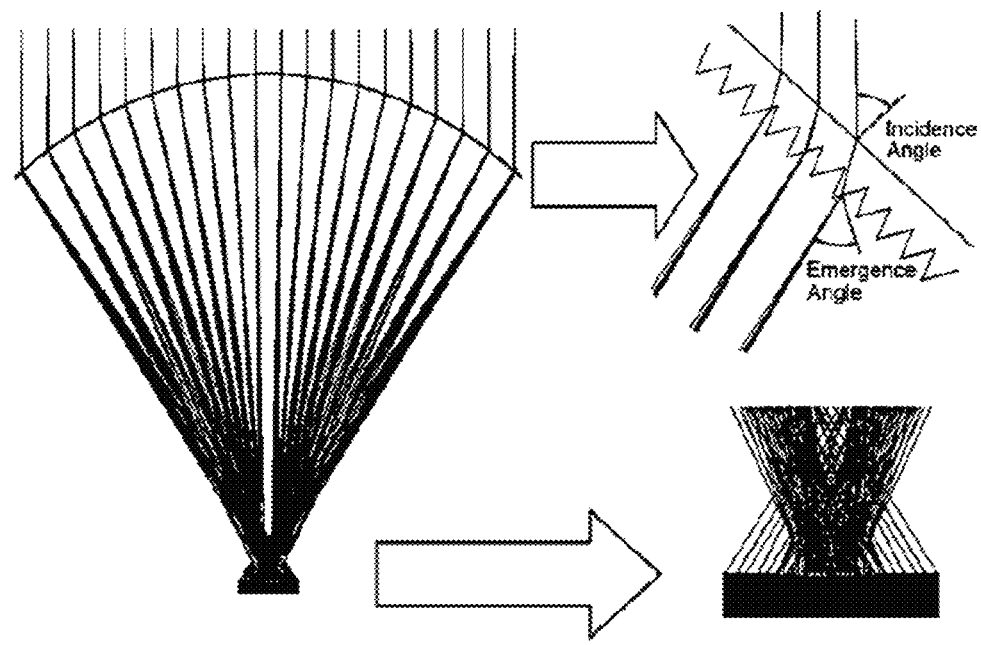
Figure 9A:
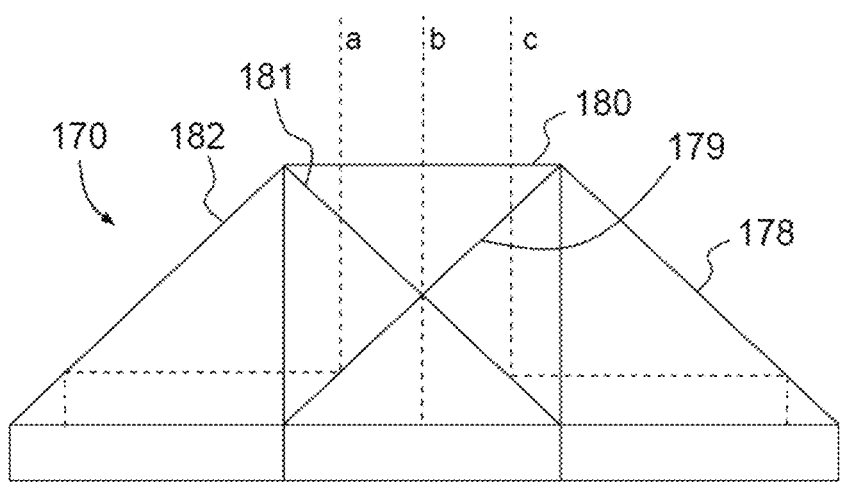
FIGS. 9a and 9b illustrate examples of spatio-chromatic separation architecture according to the known art.
Figure 9B:
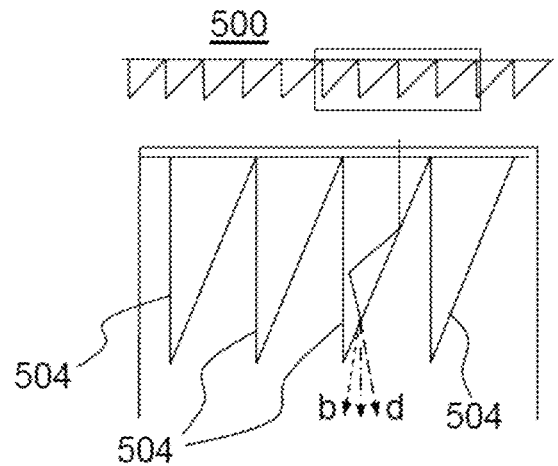
Figure 10:
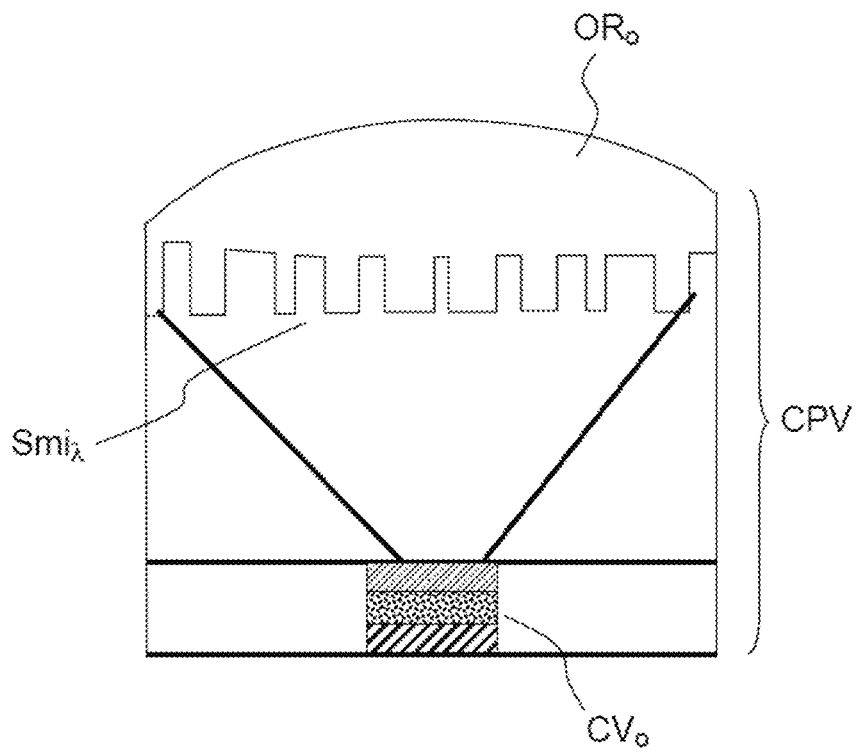
FIG. 10 schematically represents a photovoltaic module according to the invention.

FIG. 10 schematically represents a variant photovoltaic module of the present invention $CPV_o$, comprising a photovoltaic cell $CV_o$ and a concentration optic device, also called concentrator, comprising the diffractive structure $Smi_\lambda$ comprising subwavelength patterns, associated with a refractive structure $OR_o$ having a curved surface. The solar flux FLs is picked up by the photovoltaic cell made up of vertical multijunctions.

Figure 11:
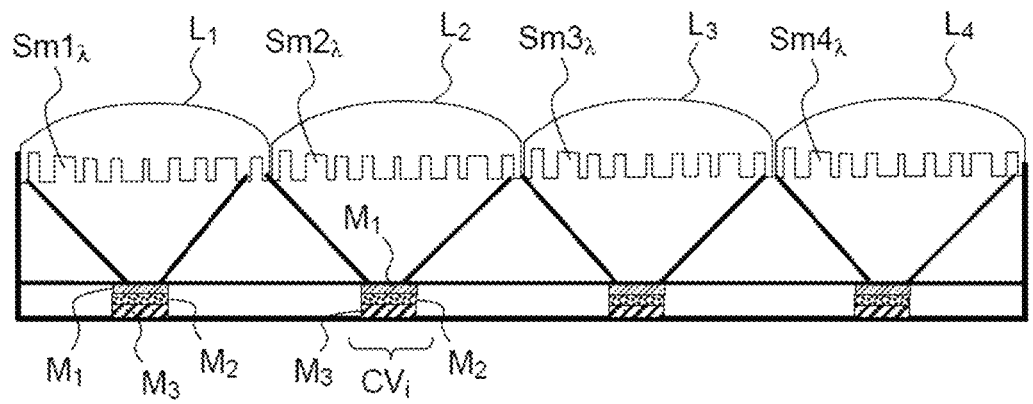
FIG. 11 schematically represents a variant of the invention comprising a set of cells CV with vertical multijunctions.

FIG. 11 schematically represents a variant photovoltaic module of the present invention comprising a set of photovoltaic cells, coupled to a set of concentration optic devices, said cells advantageously comprising vertical multijunction structures previously described and consisting, for example, of three materials sensitive in different bands of wavelengths.

More specifically, each cell CVi comprises a stack of three materials sensitive in different bands of wavelengths, M1, M2 and M3, respectively sensitive in the bands of wavelengths $\Delta\lambda_1$, $\Delta\lambda_2$ and $\Delta\lambda_3$. The concentration optic device comprises a set of microlenses $L_1$, $L_2$, $L_3$, $L_4$ and a set of structures of subwavelength patterns $Sm_{1\lambda}$, $Sm_{2\lambda}$, $Sm_{3\lambda}$, $Sm_{4\lambda}$.

Figure 12:
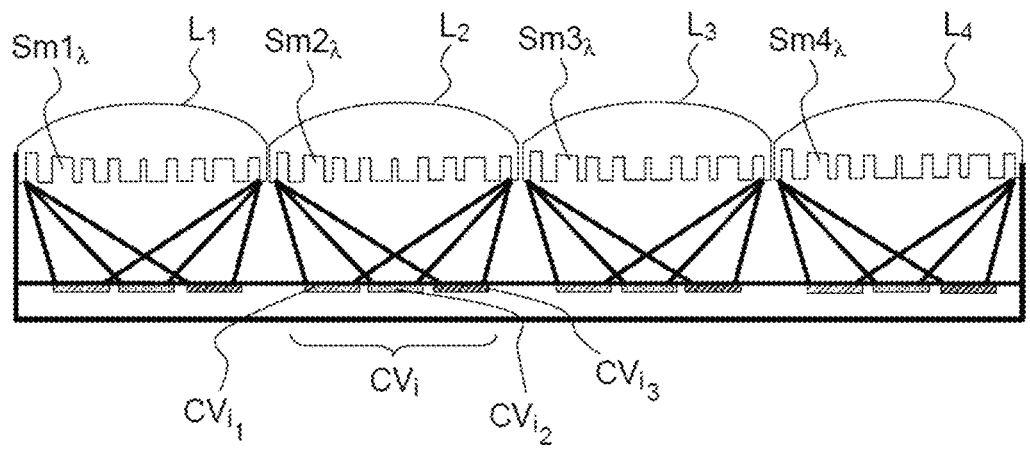
FIG. 12 schematically represents a variant of the invention comprising a set of cells CV comprising individual subcells arranged laterally.

FIG. 12 schematically represents a variant photovoltaic module of the present invention comprising a set of photovoltaic cells coupled to a set of concentration optic devices, each cell CVi comprising a set of single junction subcells CVij arranged laterally, each of the three subcells represented comprising a material sensitive in a band of wavelengths different to those of the other subcells belonging to the same cell. More specifically, each cell CVi comprises a set of three subcells (three subcells are represented: $CVi_1$, $CVi_2$, $CVi_3$) comprising three materials that are photosensitive in different bands of wavelengths, M1, M2 and M3, respectively sensitive in the bands of wavelengths $\Delta\lambda_1$, $\Delta\lambda_2$ and $\Delta\lambda_3$. The concentration optic device comprises a set of microlenses $L_1$, $L_2$, $L_3$, $L_4$ and a set of structures associated with subwavelength patterns $Sm_{1\lambda}$, $Sm_{2\lambda}$, $Sm_{3\lambda}$, $Sm_{4\lambda}$.

The benefits, performance levels and functionalities of the subwavelength optics are detailed hereinbelow. Generally, the subwavelength optics constitute a family of optics consisting of binary structures (produced using a single masking level) of a size smaller than the wavelength etched into a dielectric material whose principle is based on the synthesis of artificial material. Typically, starting from a periodic structure of a period smaller than the average illumination wavelength of the spectrum divided by the index of the structured material, it is possible to synthesize any effective index distribution, and therefore any phase distribution, by controlling the size of the microstructures. The possible phase distributions include that of a diffractive component such as a diffraction grating or a diffraction lens, also called diffractive Fresnel lens (based on the law of diffraction, and on phase jumps of 2pi or of a few modulo 2pi, unlike the Fresnel lenses with microprisms, whose principle is based on the law of refraction). These structures have properties that are particularly suitable for effective compact optic applications, notably with high aperture and/or wide spectral band.

Furthermore, given the local technological mastery of the structures sizes, it is possible to control the diffracted light energy directed in different directions according to the wavelength, targeting the different photosensitive cells, sensitive to different regions of the spectrum. More particularly, it is possible to increase the light flux arriving on certain photosensitive cells which would be less effective, so as to obtain, for the different junctions, almost identical efficiencies and avoid having the lowest junction efficiency limit the current for all the junctions as a result of the series assembly. Similarly, the design of the component makes it possible to adapt the surface area of the junctions (different cell widths) to balance the efficiency of the different junctions relative to one another for an optimum series assembly.

From a technological point of view, this family of optics has the advantage of having a binary profile: it requires only a single lithography step, without mask alignment unlike the multilevel optics, which reduces their final efficiency. The profiles are compatible with volume manufacturing means such as nano imprint, moulding or hot embossing, and many other techniques, the master being itself able to be manufactured with the means of the semiconductor industry (ICP etching and electronic lithography).

These technologies advantageously use materials that are light and transparent in the visible such as polydimethylsiloxane PDMS, poly(methyl methacrylate) PMMA, polycarbonate PC.

At the performance level, these optics exhibit a capacity to address even optics with high numerical aperture as described in the articles by: Ph. Lalanne, S. Astilean, P. Chavel, E. Cambarnd H. Launois, "Blazed·binary subwavelength gratings with efficiencies larger than those of conventional échelette gratings". Opt. Lett. 23. 1081·1083 (1998) and by M S. L Lee, Ph Lalanne, J C. Rodier, P Chavel, E Cambril, Y Chen, "Imaging with blazed·binary diffractive elements", Opt. A: Pure Appl. Opt. Vol. 4, S119 (2002).

Figure 13A:
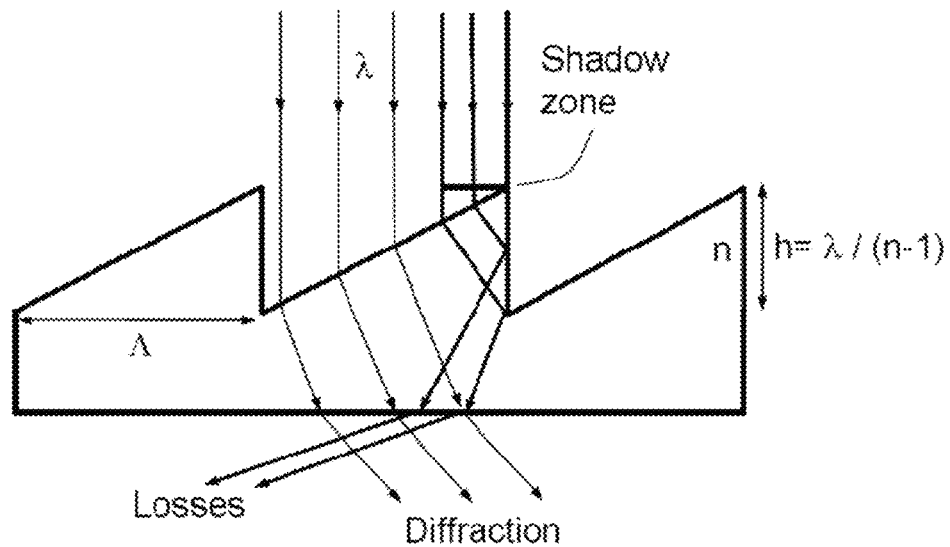
FIGS. 13a and 13b illustrate a simplified representation of the shadowing effect and of the drop in diffraction efficiency as a function of the deflection angle in the case of a diffraction optic comprising a microprism grating.
Figure 13B:
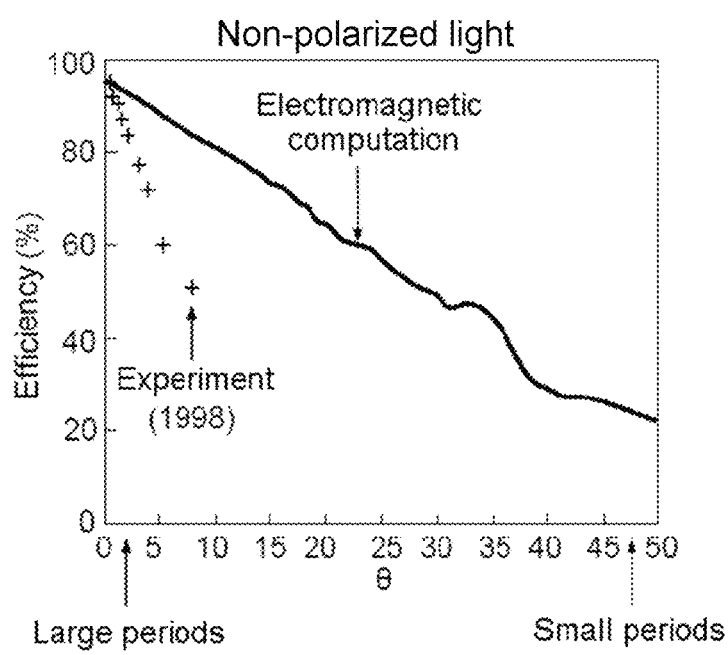

They are of particular interest for the compactness of the devices, which is difficult in the case of the conventional diffractive optics, as FIGS. 13a and 13b show by respectively illustrating a simplified representation of the shadowing effect by ray tracing and the drop in diffraction efficiency as a function of the deflection angle of a diffraction grating (equivalent to the half-aperture angle of a lens). The dotted line shows the theoretical drop in diffraction efficiency of a blazed grating etched in glass (n=1.5).

In reality, the drop in diffraction efficiency of the conventional diffractive lenses with high apertures is all the greater experimentally because it is difficult to produce the jumps of $2\pi$ with an abrupt transition.

Furthermore, the subwavelength optics exhibit unique dispersion properties, which makes it possible to have them work effectively over a wide spectral band. Typically by structuring an AsGa material, a dispersion of the refractive index makes it possible to achieve a variation $\Delta n=0.36$ over the 8-12 µm band compared to a value of 0.02 for a non-structured material. By virtue of this property of dispersion of the effective index, it is possible to design diffractive optics whose efficiency is maintained over a wide band, as described in the article by C. Sauvan, Ph. Lalanne, M-S. L. Lee, "Broadband blazing with artificial dielectrics", Opt. Lett. 29, 1593-1595 (2004), in the patent application US 2007/0103782, in the article by C. Ribot, PhD Thesis from University of Paris Sud (2008) or in that of M-S. L. Lee, S. Bansropun, O. Huet, S. Cassette, B. Loiseaux, A. P. Wood, C. Sauvan and P. Lalanne, "Sub-wavelength structures for broadband diffractive optics", ICO 2005, 0602-34 (2005).

This property is of great interest for the solar applications for which the spectrum is typically very wide [380 nm-1600 nm].

Figure 14:
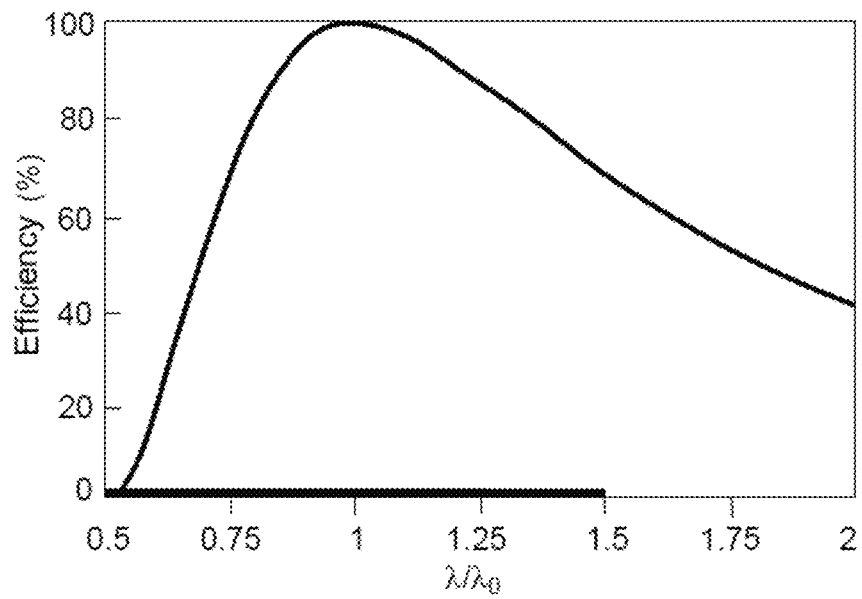
FIG. 14 illustrates the diffraction efficiency in the scalar domain of a lens as a function of the ratio of the illumination wavelength to the design wavelength.

For example, by designing a conventional blazed diffractive lens with $\lambda_0$=800 nm, the spectral interval then lies between $0.5\lambda_0$ and $2\lambda_0$ as illustrated in FIG. 14 which gives the diffraction efficiency in the scalar domain of this lens as a function of the ratio of the illumination wavelength to the design wavelength $\lambda/\lambda_0$. Even though it is possible to adjust the design wavelength to balance the spectral losses, the drop in efficiency remains significant.

Figure 15:
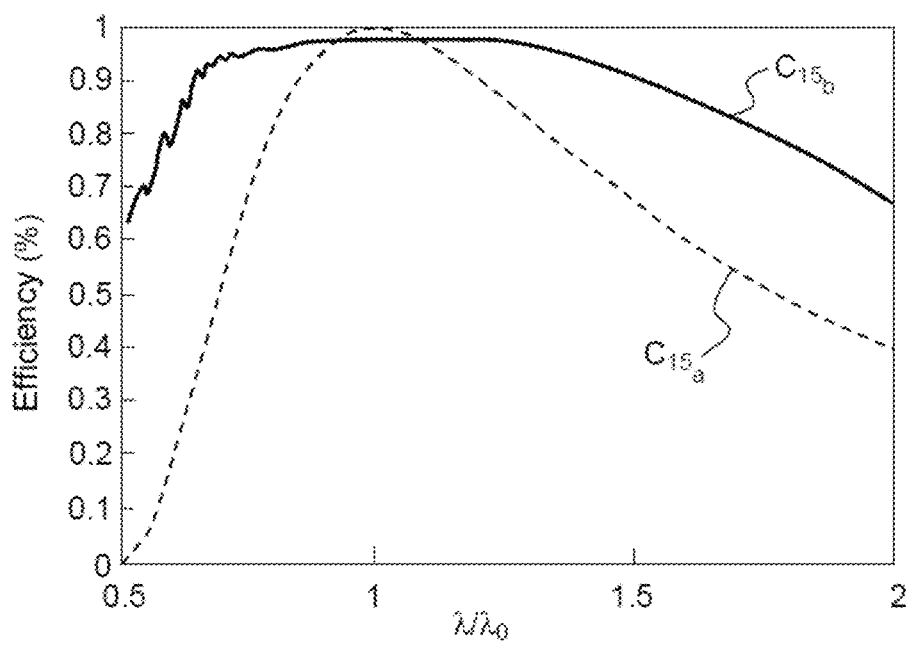
FIG. 15 illustrates the spectral behaviour of subwavelength components compared to that of a conventional blazed diffractive lens.

By way of comparison, FIG. 15 illustrates the spectral behaviour of subwavelength components compared to that of a conventional blazed diffractive lens. It emerges that the gain over the band is significant. More specifically, this figure illustrates the behaviour of the diffraction efficiency of a conventional blazed diffractive optic (dotted lines, curve $C_{15a}$) and of a subwavelength optic (continuous lines, curve $C_{15b}$) as a function of the illumination wavelength ($\lambda_0$ being the design wavelength), in the scalar domain.

Also, with these optics, the capacity to control the phase by controlling the size of the structures makes it possible not only to synthesize an optic optimized to one or more wavelengths, but also to adjust or distribute, on demand, the intensity of the different orders of diffraction, which is useful in the case of spectral separation, where the light intensity received is not the same within the spectrum.

Figure 16:
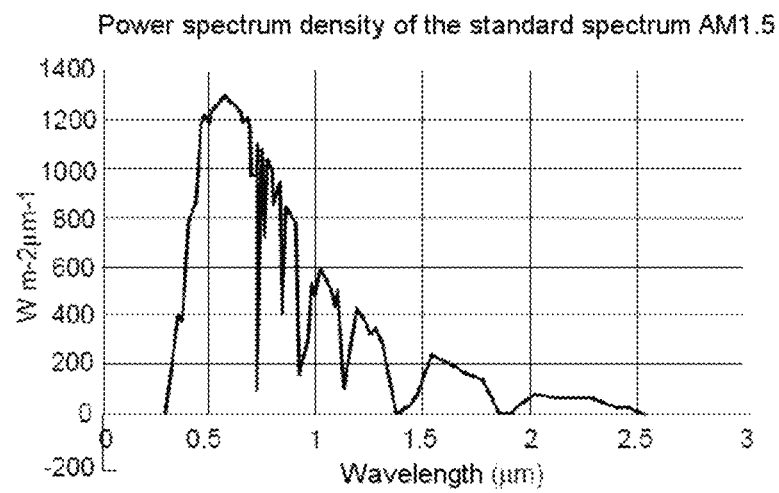
FIG. 16 illustrates the AM1.5 type solar spectrum corresponding to the solar spectrum after passing through the atmosphere, the sun forming an angle of approximately 48° relative to its position at the zenith.

An example of AM1.5 type solar spectrum is given in FIG. 16, the AM1.5 solar spectrum corresponding to the solar spectrum after passing through the atmosphere, the sun forming an angle of approximately 48° relative to its position at zenith.

An exemplary application of these components is that of the diffractive function in a refractive/diffractive achromatic system, so as to not only achromatize the focal length (diffractive function), but also to achromatize the diffraction efficiency. Thus, compared to a pure refractive solution (refractive Fresnel lens with microprisms approach), a better efficiency is obtained that is linked to a folding of the longitudinal chromatism of the focal length without suffering losses of the wideband diffraction efficiency of a conventional diffractive lens.

Another example in the use of these optics is the spectral separation. They can be used as blazed grating, using the order 0 for the infrared and the order 1 for the visible and the near IR, as in the approach proposed by the Liège space centre (CSL) and described in the article by C. Michel et al., "Study of solar concentrator for space, based on a diffractive/refractive combination", "Renewable Energy and the Environment, OSA, SM2A2 (2012).

One of the benefits of the solution of the present invention thus lies in the spectrally wider diffraction efficiency without affecting the efficiency at the design wavelength (that is to say having the best efficiency) or that at the average wavelength, even in the presence of a compact system with a greater deflection angle of the order 1 (typically in the case of a×10 concentration, and a focal distance of 5 mm), which is not the case with a conventional blazed grating.

In a variant of the invention, the concentration optic device can comprise a subwavelength grating of "distributor" type, for which the choice of the sizes of its constituent subwavelength structures makes it possible to engineer the angles and orders of diffraction to distribute/allocate the energy spatially and spectrally over laterally arranged single-junction cells.

In a variant of the invention, the laterally arranged single-junction cells may or may not be at the same level horizontally.

In a variant of the invention, the laterally arranged single-junction cells may or may not be of the same size.

Figure 17:
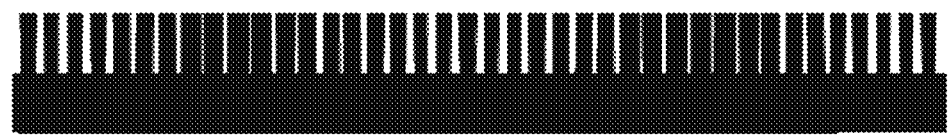
FIG. 17 illustrates an exemplary concentration optic device comprising a subwavelength grating of distributor type.

Studies have shown the capacity of the subwavelength components of "distributor" type to laterally separate different orders of diffraction with controlled efficiencies for a beam splitter application as described in the article by G. Bloom, Ch. Larat, E. Lallier, M-SL. Lee-Bouhours, B. Loiseaux, J-P. Huignard, "Design and optimization of a high efficiency array generator in the mid-IR with binary subwavelength grooves", Appl. Opt. 50, 701-709 (2011) and the thesis by Guillaume Bloom: "Combinaison cohérente de lasers à cascade quantique (Coherent Combination of Quantum Cascaded Lasers)" upheld on 14 Feb. 2012, Paris University XI ORSAY. FIG. 17 illustrates an exemplary subwavelength grating of "distributor" type making it possible to create a number of orders of diffraction with controlled energies. In the case of the documents cited, the aim of the grating was to produce diffracted orders with almost equal energies, but this concept applies also to producing orders of diffraction with the desired energy distribution according to the orders of diffraction.

The solution of the present invention is of particular interest for space applications. In effect, the device of the invention is a static system, not requiring any step of deployment of the concentrators (detailed previously in a prior art solution) and remains compatible with a tracking system for satellite (typically of the order of 3° for a focal length of 5 mm, for a concentration rate of 12). By proposing a very compact solution, it is also possible to reduce the volume of the panels and simplify the solution and the test means on the ground to be implemented before the launch of the satellite.

Moreover, the device of the invention is based on the use of subwavelength optics that can be produced in light materials making it possible to synthesize efficient planar optics with shorter focal length.

The solution can also be combined with a spectral separation technique, to increase the cell conversion efficiency.

The applicant has thus solved the following problems:
- to have a compact system, therefore a short focusing distance, typically less than one centimetre to a few millimetres for example or less, and components of little bulk;
- to combine a focusing function and a chromatism correction function;
- to ensure a good efficiency of the concentrator over the entire spectrum addressed, by proposing association of a focusing function with very short focal length with a diffractive function with numerical aperture smaller than that of the refractive component.

The different functions provided by the various elements of the architecture are:
- a compactness by virtue of the use of microlenses and of subwavelength optics;
- a better concentration optical efficiency on the photovoltaic cell through the refractive-diffractive combination, which allows for a better longitudinal achromatization by compensation of the difference between $f(\lambda_m)$ and $f(\lambda_M)$. By way of example, an initial difference of ~350 μm approximately between $f(\lambda_m=350$ nm) and $f(\lambda_M=1400$ nm), for an open system with f/D=1, and f=5 mm, is brought to almost 0 between these two wavelengths by virtue of the longitudinal achromatization. More specifically, within the interval $[\lambda_m; \lambda_M]$, the variation of the focal length is reduced by at least a factor 3;
- a better spectral efficiency by exploiting the wideband properties of the subwavelength optics.

Figure 18:
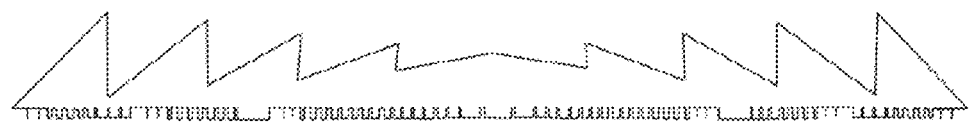
FIG. 18 illustrates an exemplary concentration optic device used in a variant for the photovoltaic module of the invention.

According to a variant of the invention, and this to obtain an even more compact system, the concentration optic device can comprise a refractive Fresnel lens-type system with microprisms, combined with a subwavelength diffractive lens, as illustrated in FIG. 18.

According to this example, the hybrid refractive/diffractive concentrator thus comprises a refractive component consisting of microprisms and a diffractive component consisting of subwavelength structures.

Advantageously, this concentration solution can be combined with a spectral separation technique, whose function can also be integrated on the diffractive face at the same time as the longitudinal chromatism correction function. The principle consists in laterally separating the different focusing points as a function of the wavelength of the solar spectrum using a grating function, integrated on the diffractive component, using single junctions of material distributed laterally and sensitive in different bands of wavelengths, as described previously. The advantage of the subwavelength structure for the implementation of the spectral separation function is the possibility of adjusting the energy directed onto each of the laterally distributed junctions and allowing for substantially different junction surface areas, for a better efficiency of the series assembly, while maintaining a good diffraction efficiency over the entire spectrum.

Figure 19:
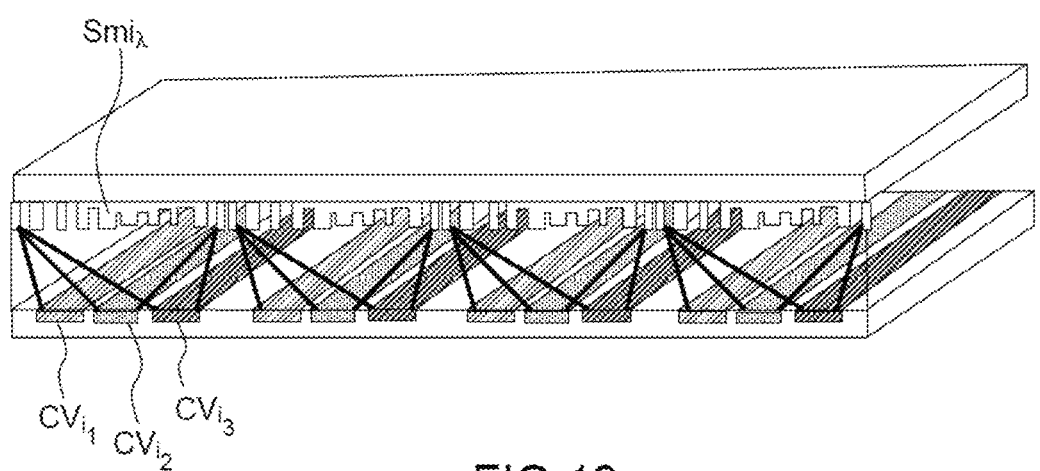
FIG. 19 illustrates a second inventive variant photovoltaic module of the invention incorporating a focusing function in a subwavelength diffractive structure.

According to a variant of the invention, the photovoltaic module can comprise a concentration optic device ensuring a focusing function, as illustrated in FIG. 19, a set of cells CVi, that can comprise subsets of cells CVij (CVi$_1$, CVi$_2$, CVi$_3$ represented) such as those described in the first variant of the invention.

Figure 20A:
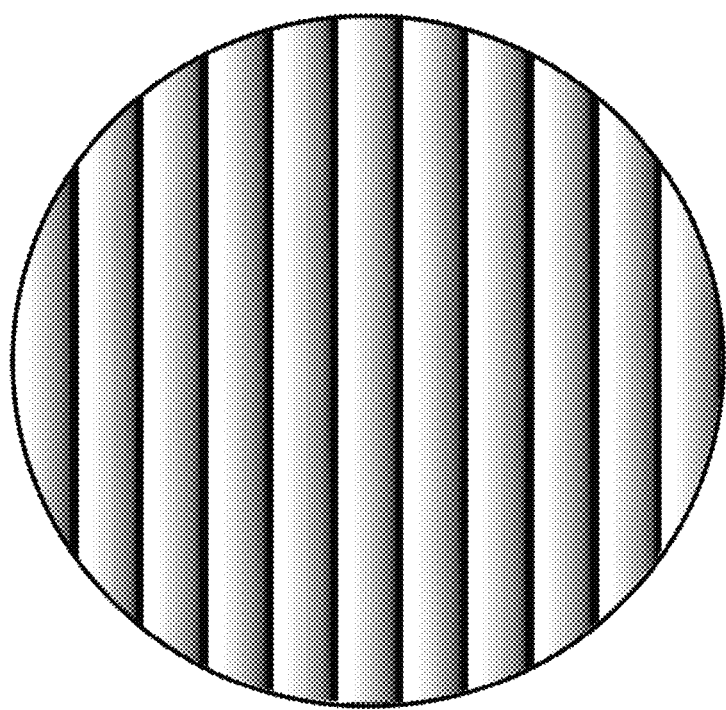
FIGS. 20a and 20b illustrate an exemplary concentration optic device used in the invention including a spectral separation function.
Figure 20B:
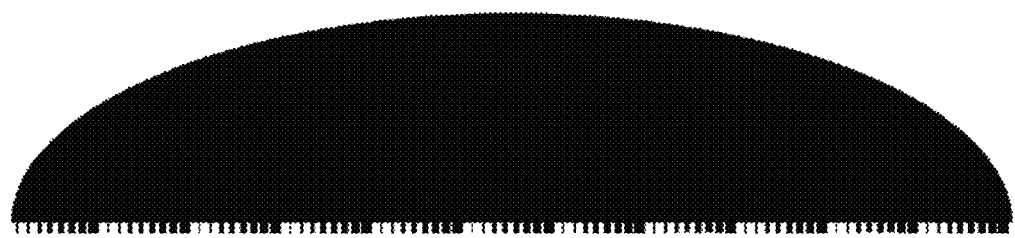

According to a variant of the invention, the photovoltaic module can comprise a concentration optic device ensuring a focusing function and a spectral separation function, as illustrated in FIGS. 20a and 20b. The concentration optic device synthesizes the focusing function and the lateral spectral separation function, thus making it possible to obtain a very compact system.

The optic device exhibits a concentration rate C (that can be equal to 12, C=12), defined as the diameter of the concentration device divided by the width of the cell.

By assuming the use of $Nb_{cell}$ of individual subcells coupled to the concentration optic device, sensitive to different regions of the solar spectrum, juxtaposed alongside one another in batches, and of cell width, the period of the grating is given by the relationship $$\Lambda = \frac{\lambda_{Max} - \lambda_{min}}{2\sin\left(\operatorname{atan}\left(\frac{Nb_{cell} \cdot D}{2f \cdot C}\right)\right)}.$$

For a component designed in its order 1 of diffraction, the period depends only on the ratio f/D and on the concentration rate and on the number of spectral "pathways" or individual subcells per concentrator.

The table below gives examples of structures, assuming $Nb_{cell}=3$ and provides period values expressed in microns, that can use an open silica lens with f/D=1 (focal length/diameter), for example with a diameter of approximately 5 mm.

| C | f/D | Λ |
|---|-----|-----|
| 9 | 1 | 3 |
| 9 | 0.5 | 1.6 |
| 12 | 1 | 4 |
| 12 | 0.5 | 2.1 |
| 20 | 1 | 6.7 |
| 20 | 0.5 | 3.4 |

The patterns of the diffractive structure exhibit widths of between 0 and 240 nm and heights of 2 microns.

According to a variant of the invention, the concentration optic device used in the present invention can also ensure a longitudinal aberration correction function.

Figure 21A:
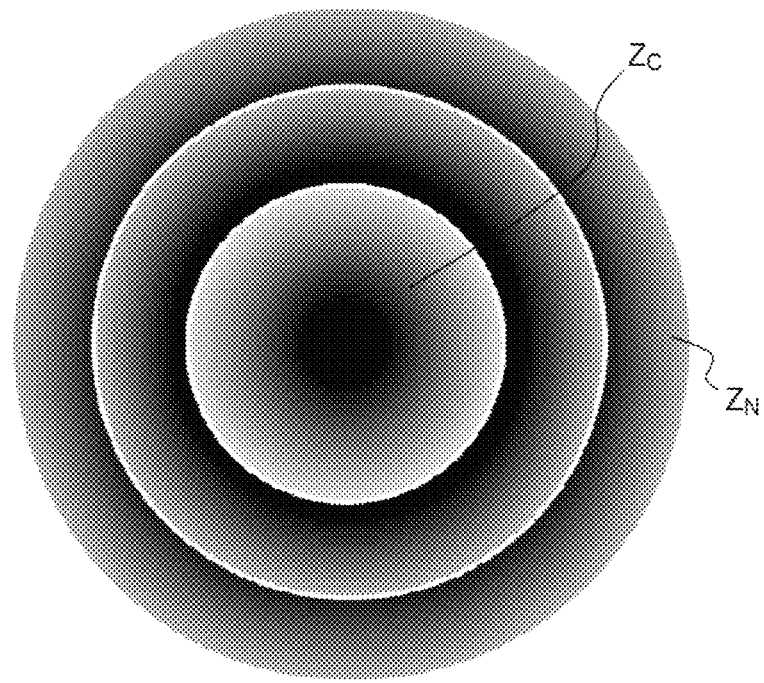
FIGS. 21a and 21b illustrate an exemplary concentration optic device used in the invention including a longitudinal aberration correction function.
Figure 21B:
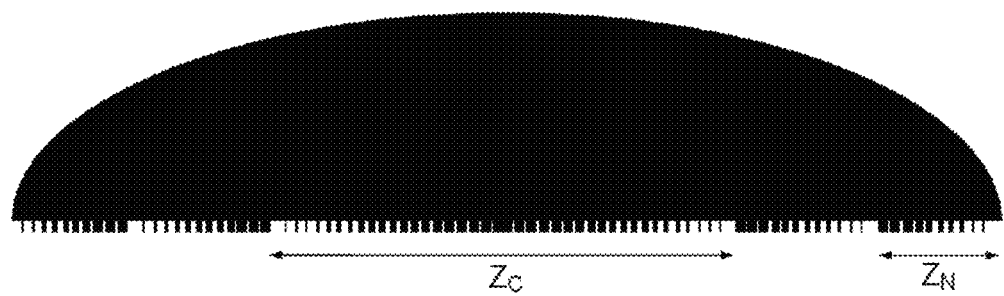

Such a component is illustrated in FIGS. 21a and 21b and has a central zone $Z_c$ and outer zones; only the outermost, referenced $Z_N$, is referenced in the figures.

The height of the patterns $h_2'$ is defined below $$h_2' = \frac{\lambda_0}{n_{Max}(\lambda_0) - n_{min}(\lambda_0)},$$

in which $n_{Max}(\lambda_0)$ and $n_{min}(\lambda_0)$ correspond to the effective indexes for a diffractive structure consisting of subwavelength patterns for a component operating in its order 1 of diffraction.

Typically, $n_{Max}(\lambda_0)-n_{min}(\lambda_0)$ can be equal to approximately 0.5 for a silica-type material (n~1.5), and 1 for a silicon nitride (n~2).

These values are calculated by a method for solving the diffraction problem in an infinite periodic structure, called Fourier modal method or RCWA (Rigorous Coupled-Wave Analysis). More particularly, the effective index in the periodic structure is given by the effective index of the Bloch mode being propagated in the subwavelength structure.

Figure 22:
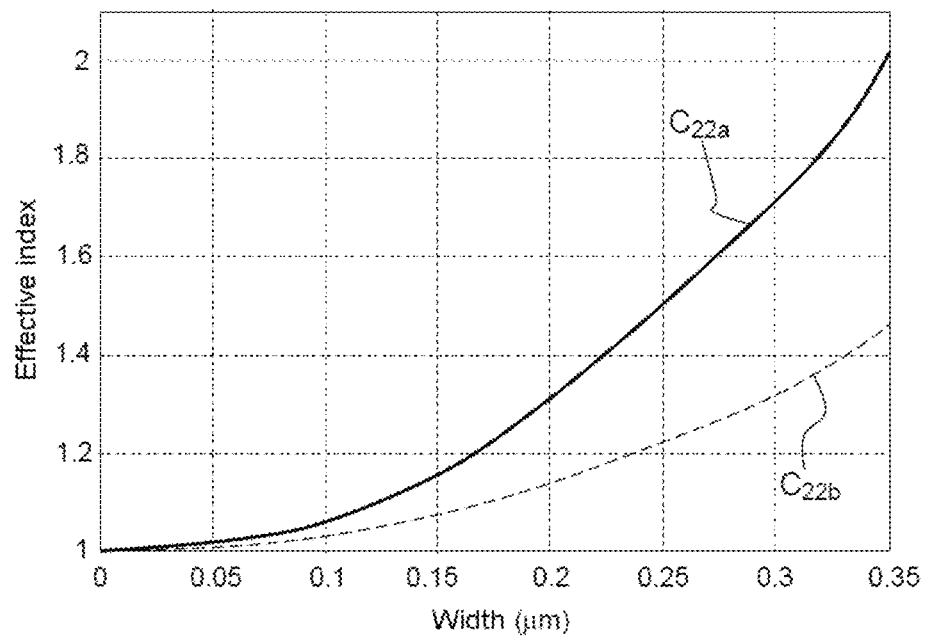
FIG. 22 illustrates an example of variation of effective index with the width of the patterns, used in the exemplary concentration optic device illustrated in FIGS. 21a and 21b.

By way of example, FIG. 22 gives the effective indexes of a periodic subwavelength structure consisting of pillars of square section, of 350 nm period as a function of the width of the pillars, for pillars etched in silicon nitride or in silica, for an illumination at 800 nm. The curve $C_{22a}$ relates to the silicon nitride, the curve $C_{22b}$ relating to the silica.

The number of zones is given by:

$$N = \text{floor}\left(\frac{D^2}{8fd_2 \cdot \lambda_0}\right),$$

where "floor" is the "staircase" function, that is to say that floor (x) corresponds to the integer less than or equal to x.

The radius of the central zone is equal to:

$r_1 = \sqrt{2.fd_2.\lambda_0}$.

The width of the zone n is given by n, lying between 2 and N (the maximum number of zones):

width$^n = r_n - r_{n-1} = \sqrt{2.fd_2.\lambda_0} \cdot (\sqrt{n} - \sqrt{n-1})$, or, for the last zone width$^N = r_N - r_{N-1} = \sqrt{2.fd_2.\lambda_0} \cdot (\sqrt{N} - \sqrt{N-1})$, where $fd_2$ represents the focal length of the diffractive component and depends on the constringences $v_1$ and $v_2$, respectively of the refractive and diffractive component which constitute the lens sought of focal length f which constitutes the concentrator.

The constringences $v_1$ and $v_2$ depend essentially on the material constituting the diffractive component and on the wavelengths chosen by definition over the band considered, here $\lambda_{min}$=400 nm, $\lambda_{Max=}$=1400 nm:

$$v_2 = \frac{\lambda_0}{\lambda_{min} - \lambda_{Max}},$$

$$fd_2 = -f \cdot \frac{v_1 - v_2}{v_2},$$

$$v_1 = \frac{n(\lambda_0) - 1}{n(\lambda_{min}) - n(\lambda_{Max})}$$

| | λ | | | | |
|---|---|---|---|---|---|
| | $\lambda_{min}=$ 400 nm | $\lambda_0=$ 800 nm | $\lambda_{Max=}$ = 1400 nm | 400 nm-1400 nm | |
| | $n(\lambda_{min})$ | $n(\lambda_0)$ | $n(\lambda_{Max})$ | $v_1$ | $v_2$ |
| Silica | 1.4701 | 1.4533 | 1.4458 | 18.6543 | −0.8000 |
| Silicon nitride | 2.0739 | 2.0102 | 1.9924 | 12.3924 | −0.8000 |

The refractive lens of the concentrator is, for its part, defined by its focal length $fd_1$ given by:

$$fd_1 = f \cdot \frac{v_1 - v_2}{v_1}.$$

By way of example, by considering an open silica lens with f/D=1 (focal length/diameter), of diameter approximately 5 mm, used for a×12 concentration rate. The diffractive lens making it possible to reduce the longitudinal chromatic aberration can consist of different diffractive Fresnel zones of a typical height of approximately 2 μm for a use in its order 1 of diffraction. The central zone is a disc of radius 441 μm and the outermost zone is a ring 39 μm wide.

The patterns of the diffractive structure exhibit widths of between 0 and 240 nm and heights of 2 microns.

According to a variant of the invention, the concentration optic device can comprise two diffractive structures on each of its faces, one of the diffractive structures making it possible to ensure a focusing function and one diffractive structure ensuring a spectral separation function.

Figure 23A:
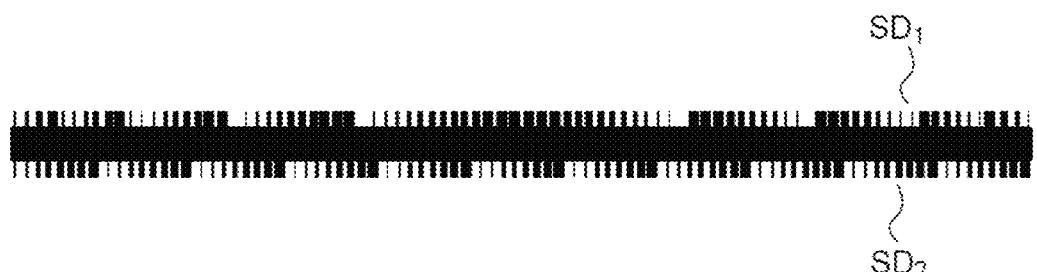
FIGS. 23a, 23b and 23c illustrate a concentration optic device comprising a diffractive structure ensuring a focusing function and a diffractive structure ensuring a spectral separation function.
Figure 23B:
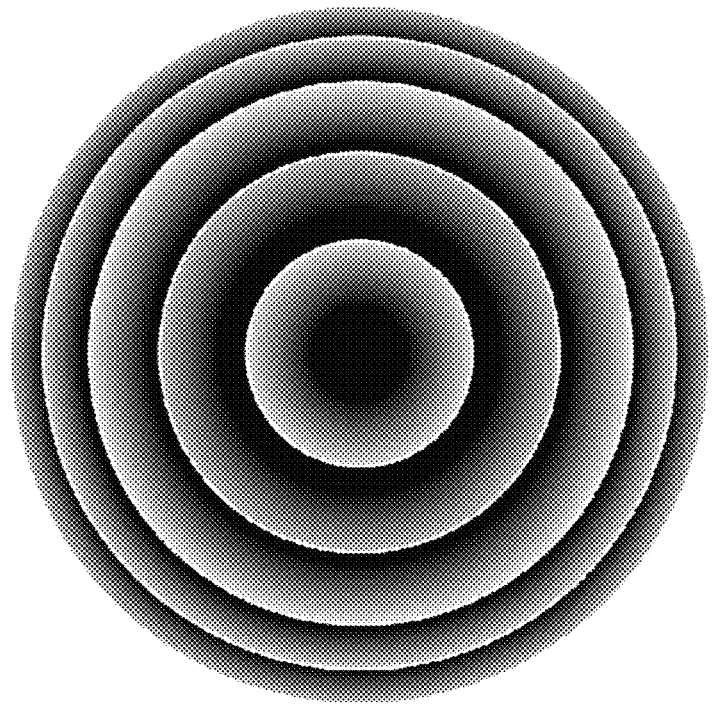
Figure 23C:
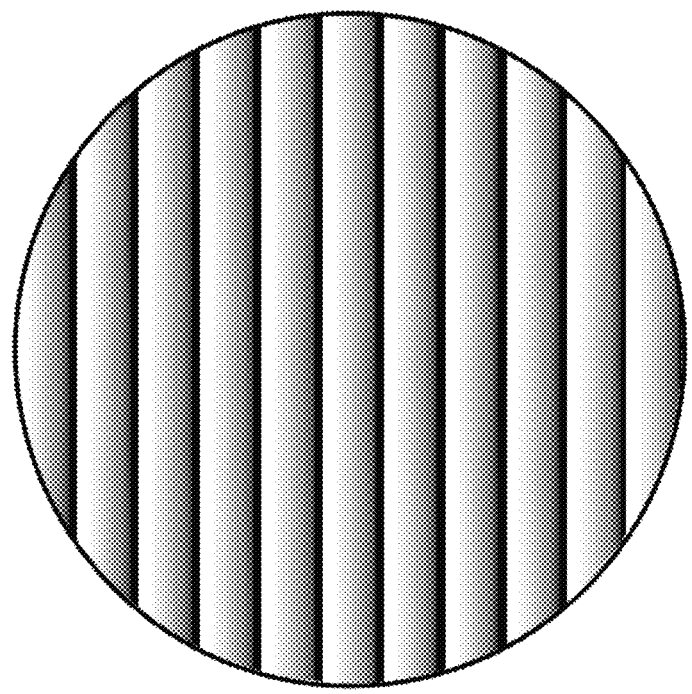

FIGS. 23a, 23b and 23c thus illustrate an exemplary configuration consisting of a focusing diffractive lens located on one face and a diffraction grating for the spectral separation located on the second face.

FIG. 23a gives a simplified view of a cross section of the component across its diameter with a first diffractive structure $S_{D1}$ for the focusing and a second diffractive structure $S_{D2}$ for the spectral separation.

FIG. 23b gives a plan view of the component, the grey levels representing a variation of effective index coded by virtue of the subwavelength patterns. The darker regions correspond to higher effective index levels. The lighter zones correspond to lower effective index levels.

FIG. 23c gives a bottom view of the component, the grey levels representing a variation of effective index coded by virtue of the subwavelength patterns.

In this example, the concentrator consists of a diffractive lens and of a diffraction grating. These two elements are located on each of the faces of a single component which serves both as concentrator and as spectral separator. Each function is produced using subwavelength patterns. The calculation of the diffractive lens, serving as focusing function, is different from that of the lens used to reduce the longitudinal chromatic aberrations, by its focal length. A typical focal length is 5 mm for a focusing function. Based on the preceding equations, and considering an open lens of silica with f/D=1 (focal length/diameter), of approximately 5 mm diameter, the diffractive lens making it possible to produce the focusing function is made up of different diffractive Fresnel zones of approximately 2 μm typical height for a use in its order 1 of diffraction. The central zone is a disc of radius 89 μm and the outermost zone is a ring 1.6 μm wide. The different zones are made up of subwavelength patterns.

The patterns of the diffractive structure exhibit widths of between 0 and 240 nm and heights of 2 microns.

The use of an all-diffractive subwavelength optic on its own can make it possible to produce the focusing function, despite a high aperture f/1, in a very compact system, typically 5 mm, or typically 16 times more compact than the device presented previously by the company Entech.

Figure 24:
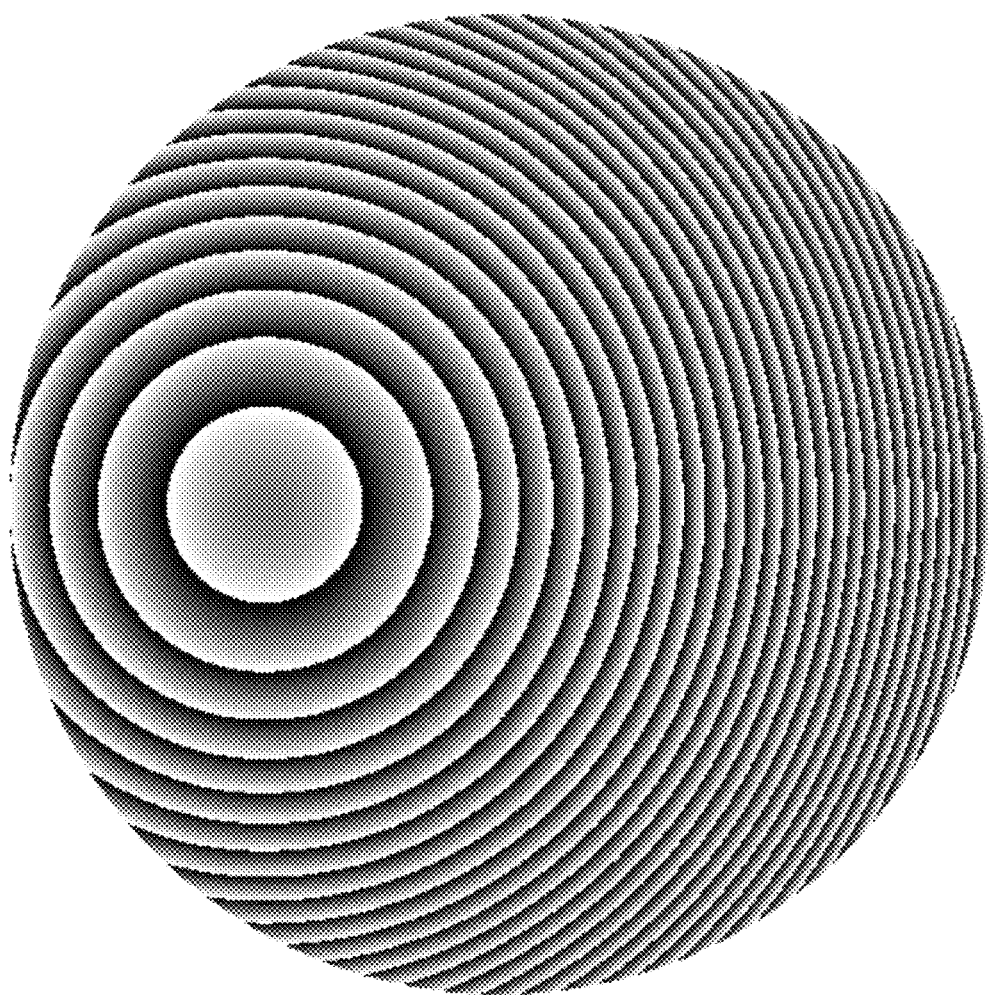
FIG. 24 illustrates a concentration optic device comprising a single diffractive structure ensuring a focusing function and a spectral separation function.

According to a variant of the invention, the concentration device can comprise a single diffractive structure in which the two functions can be combined and implemented on a single face of the component, called bottom face, facing the photovoltaic cell, the opposite so called top face being planar. FIG. 24 thus illustrates the bottom view of such a concentration device. The grey levels represent a variation of effective index coded by virtue of the subwavelength patterns. The darker regions correspond to higher effective index levels. The lighter regions correspond to lower effective index levels (it should be noted that, for greater clarity in this figure and the preceding ones, these figures are not to scale, not showing the exact number of rings, this number in this case being higher).

The invention claimed is:

1. A photovoltaic module comprising:
    at least one photovoltaic cell; and
    at least one concentration optic device configured to be illuminated by a light flux emitting at at least one illumination wavelength belonging to a band of wavelengths defined by a minimum wavelength and a maximum wavelength, said band of wavelengths being of solar radiation on an order of 380 nm to 1600 nm,
    wherein said at least one concentration optic device is a monolithic component having a first surface and a second surface, said at least one concentration optic device comprising at least one diffractive structure on said first surface and a focusing structure on said first surface, each surface operating in transmission, said at least one diffractive structure having one level subwavelength patterns with at least one dimension less than or equal to an average illumination wavelength divided by a refractive index of said at least one concentration optic device, said subwavelength patterns being separated by subwavelength distances between centers of adjacent subwavelength patterns,
    wherein said one level subwavelength patterns codes a variation of effective index in the plane of said first surface, and said subwavelength distances are periodic, and
    wherein the focusing structure comprises a second diffractive structure comprising subwavelength patterns.

2. The photovoltaic module of claim 1, wherein the concentration optic device comprises a diffractive structure comprising the subwavelength patterns and a refractive optic.

3. The photovoltaic module of claim 1, wherein the concentration optic device comprises diffractive structures on the second surface.

4. The photovoltaic module of claim 2, wherein said refractive optic comprises at least one curved surface refractive lens.

5. The photovoltaic module of claim 2, wherein said refractive optic comprises at least one Fresnel lens having a set of microprisms having a length of approximately a few hundred microns.

6. The photovoltaic module of claim 2, wherein the refractive optic comprises the same material as the subwavelength patterns.

7. The photovoltaic module of claim 1, wherein said at least one photovoltaic cell comprises at least one photosensitive material being sensitive to said band of wavelengths.

8. The photovoltaic module of claim 1, wherein said at least one photovoltaic cell comprises one of:
    a vertical multijunctional structure having a stack of materials, each of said materials being at least sensitive in a subband of wavelengths of said band of wavelengths; and
    a horizontal multijunctional structure having a set of individual adjacent photovoltaic subcells in a plane comprising materials sensitive in subbands of wavelengths of said band of wavelengths.

9. The photovoltaic module of claim 8, further comprising photovoltaic subcells having different sizes relative to one another.

10. The photovoltaic module of claim 1, wherein said at least one photovoltaic cell comprises a horizontal multijunctional structure having a set of individual adjacent photovoltaic subcells in a plane comprising materials sensitive in subbands of wavelengths of said band of wavelengths.

11. The photovoltaic module of claim 1, wherein said at least one photovoltaic cell comprises subsets of individual photovoltaic cells in different planes.

12. The photovoltaic module of claim 1, wherein the subwavelength patterns comprise pillars or holes.

13. The photovoltaic module of claim 1, wherein said at least one concentration device comprises a diffractive structure with patterns of subwavelength dimensions having a longitudinal aberration correction function and/or a lateral spectral separation function.

14. The photovoltaic module of claim 1, wherein said at least one concentration optic device comprises silica, glass, a silicon nitride type material, polydimethylsiloxane, poly (methyl methacrylate), or polycarbonate.

15. The photovoltaic module of claim 1, wherein the dimensions of the subwavelength patterns are on an order of 80 nm to 250 nm in width or diameter, and 1 to 2 µm in height.

16. The photovoltaic module of claim 1, wherein the at least one photovoltaic cell comprises a set of photovoltaic cells.

17. A photovoltaic module comprising:
    at least one photovoltaic cell; and
    at least one concentration optic device configured to be illuminated by a light flux emitting at at least one illumination wavelength belonging to a band of wavelengths defined by a minimum wavelength and a maximum wavelength, said band of wavelengths being of solar radiation on an order of 380 nm to 1600 nm,
    wherein said at least one concentration optic device is a monolithic component having a first surface and a second surface, said at least one concentration optic device comprising at least one diffractive structure on said first surface and a focusing structure on said first surface, each surface operating in transmission, said at least one diffractive structure having one level subwavelength patterns with at least one dimension less than or equal to an average illumination wavelength divided by a refractive index of said at least one concentration optic device, said subwavelength patterns being separated by subwavelength distances between centers of adjacent subwavelength patterns,
    wherein said at least one concentration device comprises a diffractive structure with patterns of subwavelength dimensions having a longitudinal aberration correction function and/or a lateral spectral separation function, and
    wherein said at least one concentration device comprises a central zone and outer zones, each zone being made up of patterns of pillars having round or square sections and/or hole types with round or square section, the dimensions of said patterns varying from one zone to the other so as to code a variation of an effective index and therefore a phase variation.

18. The photovoltaic module of claim 16, wherein the subwavelength patterns have at least one dimension that is less than said average illumination wavelength divided by the refractive index of the concentration optic device.

19. The photovoltaic module of claim 16, wherein the concentration optic device comprises a set of microlenses, each microlens being coupled to a diffractive structure comprising patterns of subwavelength dimensions.

20. The photovoltaic module of claim 16, wherein the concentration optic device comprises a set of Fresnel lenses with microprisms, each Fresnel lens being coupled to a diffractive structure comprising patterns of subwavelength dimensions.

21. The photovoltaic module of claim 1, wherein the at least one diffractive structure comprises two diffractive structures comprising subwavelength patterns, one of the two diffractive structures providing a focusing function.

22. A solar panel for a satellite comprising at least one photovoltaic module according to claim 1.

23. The photovoltaic module of claim 17, wherein the patterns of pillars have lateral dimensions less than or equal to 350 nm, a spacing between centers of two consecutive zones being approximately 350 nm, and heights of the patterns being between approximately 1 micron and 10 microns.

24. A photovoltaic module comprising:
at least one photovoltaic cell; and
at least one concentration optic device configured to be illuminated by a light flux emitting at at least one illumination wavelength belonging to a band of wavelengths defined by a minimum wavelength and a maximum wavelength, said band of wavelengths being of solar radiation on an order of 380 nm to 1600 nm, wherein said at least one concentration optic device is a monolithic component having a first surface and a second surface, said at least one concentration optic device comprising at least one diffractive structure on said first surface and a focusing structure on said first surface, each surface operating in transmission, said at least one diffractive structure having one level subwavelength patterns with at least one dimension less than or equal to an average illumination wavelength divided by a refractive index of said at least one concentration optic device, said subwavelength patterns being separated by subwavelength distances between centers of adjacent subwavelength patterns, wherein said one level subwavelength patterns codes a variation of effective index in the plane of said first surface, and said subwavelength distances are periodic, and wherein the at least one diffractive structure comprises two diffractive structures comprising subwavelength patterns, one of the two diffractive structures providing a focusing function.

* * * * *